(12) United States Patent
Lee et al.

(10) Patent No.: US 9,564,316 B2
(45) Date of Patent: Feb. 7, 2017

(54) METHOD OF MANUFACTURING SEMICONDUCTOR DEVICE AND METHOD OF MAINTAINING DEPOSITION APPARATUS

(71) Applicant: SAMSUNG ELECTRONICS CO., LTD., Suwon-si, Gyeonggi-do (KR)

(72) Inventors: Dong Yul Lee, Yongin-si (KR); Sang Heon Han, Suwon-si (KR); Seung Hyun Kim, Seoul (KR); Jang Mi Kim, Seoul (KR); William Solari, Hwaseong-si (KR); Hyun Wook Shim, Suwon-si (KR); Suk Ho Yoon, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/578,940

(22) Filed: Dec. 22, 2014

(65) Prior Publication Data

US 2015/0311062 A1 Oct. 29, 2015

(30) Foreign Application Priority Data

Apr. 25, 2014 (KR) .......................... 10-2014-0050270

(51) Int. Cl.
| | |
|---|---|
| *H01L 21/00* | (2006.01) |
| *H01L 29/20* | (2006.01) |
| *H01L 21/02* | (2006.01) |
| *C23C 16/34* | (2006.01) |
| *C23C 16/44* | (2006.01) |
| *H01L 33/00* | (2010.01) |

(52) U.S. Cl.
CPC .......... *H01L 21/0254* (2013.01); *C23C 16/34* (2013.01); *C23C 16/4404* (2013.01); *H01L 21/0262* (2013.01); *H01L 21/02107* (2013.01); *H01L 21/02381* (2013.01); *H01L 21/02433* (2013.01); *H01L 21/02458* (2013.01); *H01L 21/02496* (2013.01); *H01L 21/02576* (2013.01); *H01L 21/02579* (2013.01); *H01L 33/007* (2013.01)

(58) Field of Classification Search
CPC .......... H01L 21/0228; H01L 21/02178; H01L 21/0364; H01L 21/0262; H01L 21/02364
USPC .......... 438/778, 46, 592, 31, 709, 711, 694, 767,438/710, 718; 257/615, 12, 77, 103, 751, 94, 79
See application file for complete search history.

(56) References Cited

U.S. PATENT DOCUMENTS

| | | | |
|---|---|---|---|
| 5,654,043 A * | 8/1997 | Shao ................. | H01J 37/32412 118/50.1 |
| 6,372,608 B1 | 4/2002 | Shimoda et al. | |
| 6,645,830 B2 | 11/2003 | Shimoda et al. | |
| RE38,466 E | 3/2004 | Inoue et al. | |

(Continued)

FOREIGN PATENT DOCUMENTS

| | | |
|---|---|---|
| KR | 10-2012-0068184 A | 6/2012 |
| KR | 10-2012-0081480 A | 7/2012 |

*Primary Examiner* — Julio J Maldonado
*Assistant Examiner* — Moin Rahman
(74) *Attorney, Agent, or Firm* — Lee & Morse, P.C.

(57) ABSTRACT

A method of manufacturing a semiconductor device, includes forming an aluminum compound film on a surface of a process chamber by supplying an aluminum (Al) source to the process chamber, the surface contacting the aluminum source in the process chamber; disposing a wafer on a susceptor provided in the process chamber after forming the aluminum compound film; and forming a thin film for the semiconductor device on the wafer.

16 Claims, 23 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,674,497 B2 | 3/2010 | Yamazaki et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,110,889 B2 | 2/2012 | Kryliouk et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2003/0073259 A1* | 4/2003 | Namikawa ............. C30B 33/00 438/46 |
| 2003/0136333 A1 | 7/2003 | Semond et al. |
| 2004/0115937 A1* | 6/2004 | Nagai ................. C23C 16/0272 438/689 |
| 2005/0250340 A1* | 11/2005 | Chen ................... C23C 16/4404 438/758 |
| 2011/0041769 A1* | 2/2011 | Lee ........................ C23C 16/44 118/733 |
| 2012/0018753 A1* | 1/2012 | Hao ....................... H01L 33/20 257/94 |
| 2012/0061351 A1* | 3/2012 | Ohata ............... H01J 37/32091 216/67 |
| 2013/0220219 A1* | 8/2013 | Jeon ....................... H01L 31/18 118/500 |
| 2013/0285065 A1* | 10/2013 | Zhu ................... H01L 21/02458 257/76 |
| 2014/0283736 A1* | 9/2014 | Nishio ................... C23C 16/22 117/93 |

* cited by examiner

METHOD OF MANUFACTURING SEMICONDUCTOR DEVICE AND METHOD OF MAINTAINING DEPOSITION APPARATUS

CROSS-REFERENCE TO RELATED APPLICATION

Korean Patent Application No. 10-2014-0050270 filed on Apr. 25, 2014, in the Korean Intellectual Property Office, and entitled: "Method of Manufacturing Semiconductor Device and Method of Maintaining Deposition Apparatus," is incorporated by reference herein in its entirety.

BACKGROUND

1. Field

The present disclosure relates to a method of manufacturing a semiconductor device, for example, to a deposition apparatus and a method of maintaining a deposition apparatus as well as a method of manufacturing a semiconductor device.

2. Description of the Related Art

Chemical vapor deposition (CVD) apparatuses are devices for forming thin films on target deposition bodies such as semiconductor wafers via a chemical reaction. A compound thin film may be grown through a chemical reaction by injecting a source gas into a process chamber under conditions of high temperature and high pressure.

SUMMARY

Embodiments may be relied by providing a method of manufacturing a semiconductor device, including forming an aluminum compound film on a surface of a process chamber by supplying an aluminum (Al) source to the process chamber, the surface contacting the aluminum source in the process chamber; disposing a wafer on a susceptor provided in the process chamber after forming the aluminum compound film; and forming a thin film for the semiconductor device on the wafer.

At least a portion of the aluminum compound film may contain a compound combined with oxygen.

The aluminum compound film may contain a nitride satisfying $Al_xIn_yGa_{1-x-y}N$ where $0<x\leq1$, $0\leq y\leq1$, and $0<x+y\leq1$.

The aluminum compound film may contain aluminum nitride (AlN).

Forming the aluminum compound film may be performed in a temperature range from about 1000° C. to about 1200° C.

Forming the aluminum compound film may include supplying the aluminum source to an interior of the process chamber under conditions of a flow rate of about 10 μmol/min to about 1000 μmol/min and a chamber pressure of about 60 Torr to about 500 Torr.

The aluminum compound film may be an aluminum-containing nitride film, and forming the aluminum compound film may include supplying a nitrogen source together with the aluminum source, to the process chamber, to react with each other.

The nitrogen source may be supplied as a gas mixed with at least one of $N_2$ and $H_2$.

The aluminum-containing nitride film may have a thickness of 1 μm or more.

Forming the thin film for the semiconductor device may include growing a semiconductor laminate for a nitride semiconductor device.

The semiconductor laminate may include a nitride semiconductor material doped with a p-type dopant.

The semiconductor device may be a nitride semiconductor light emitting device.

The aluminum source may be supplied through a passage through which the p-type dopant is supplied.

The surface contacting the aluminum source may include an internal wall of the process chamber and a surface provided as a passage for the aluminum source.

The process chamber may include a shower head-type source spraying structure, and the surface contacting the aluminum source may include a surface provided as a passage of the source spraying structure.

Embodiments may be relied by providing a method of maintaining a deposition apparatus, including evacuating a process chamber after a deposition process is stopped and a wafer is unloaded from the process chamber; and supplying an aluminum source and a nitrogen source to an interior of the process chamber.

The method may further include, prior to evacuating the process chamber, exposing the interior of the process chamber to an external atmosphere. After evacuating the process chamber, oxygen or an oxygen reactant may remain inside the process chamber.

The aluminum source supplied to the process chamber may form an aluminum nitride bonded to the remaining oxygen or oxygen reactant.

Embodiments may be relied by providing a method of manufacturing a semiconductor device, including cutting supply of a source gas for a deposition process to an interior of a process chamber; unloading a first wafer from the process chamber; forming an aluminum compound film on a surface of the process chamber contacting the source gas, after the unloading of the first wafer; loading a second wafer in the process chamber, after forming the aluminum compound film; and resuming the supply of the source gas and depositing a thin film for a semiconductor device on the second wafer.

Before the cutting of the supply of the source gas, a run of the deposition process for the semiconductor device may be performed in plural.

Embodiments may be relied by providing a deposition apparatus, including a process chamber having an internal space; a susceptor mounted in the internal space of the process chamber and provided with at least one pocket portion to include a wafer disposed therein; a heating unit heating the susceptor; and a chamber cover in an upper part of the process chamber and provided with at least one inlet supplying a source gas, at least internal wall surfaces of the process chamber and a surface of the inlet being provided with an aluminum compound film disposed thereon.

At least a portion of the aluminum compound film may include a compound combined with oxygen.

The aluminum compound film may include an aluminum oxide disposed on the internal wall surfaces and an aluminum nitride disposed on the aluminum oxide.

The deposition apparatus may further include a shower head-type source spraying structure to dispense the source gas.

The aluminum compound film may be on a surface provided as a passage of the shower head-type source spraying structure.

Embodiments may be relied by providing a method of preparing a process chamber to manufacture a semiconductor device, including evacuating an interior of the process chamber in which a deposition process is to be performed; and supplying an aluminum source to the interior of the process chamber, the aluminum source supplied to the interior of the process chamber forming an aluminum compound bonded to impurities remaining inside the process chamber after evacuating the process chamber.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
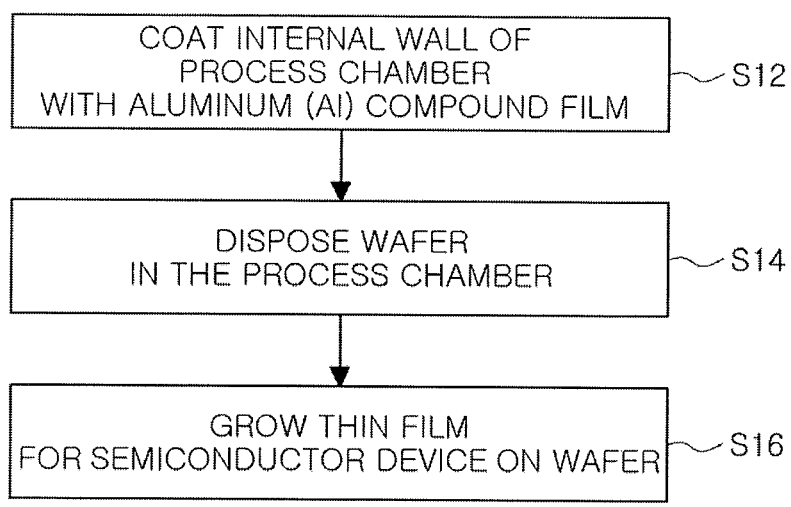
FIG. 1 illustrates a flow chart of a semiconductor device manufacturing process according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 illustrates a flow chart of a semiconductor device manufacturing process according to an exemplary embodiment of the present disclosure.

With reference to FIG. 1, a process of manufacturing a semiconductor device according to an exemplary embodiment of the present disclosure may include an initial operation of supplying an aluminum (Al) source to a process chamber (S12).

An aluminum source supplied in the process of manufacturing a semiconductor device according to an exemplary embodiment of the present disclosure may form an aluminum compound film on a surface in contact with flowing gas containing the aluminum source. The aluminum compound film may be provided as a passivation film against undesired impurities remaining in the process chamber. The residual impurities may unnecessarily chemically react with a source gas introduced in a subsequent deposition process or a reaction material thereof, and may affect deposited thin film characteristics.

The surface in contact with flowing source gas may include a surface provided as a passage on which gas flows, as well as an inner wall of the process chamber, and such an influence may be reduced. This will be described in detail with reference to a deposition apparatus illustrated in FIGS. 2 and 4.

The aluminum compound film, for example, may contain a nitride satisfying an empirical formula $Al_xIn_yGa_{1-x-y}N$ ($0<x\leq1$, $0\leq y\leq1$, $0<x+y\leq1$). The aluminum compound film may be formed of an aluminum nitride (AlN).

A metal organic chemical vapor deposition (MOCVD) process may be used to manufacture a nitride semiconductor device. A separate source and supply apparatus for the aluminum compound film may not be arranged, for example, an aluminum source and a nitrogen source used in the deposition process may be used. For example, trimethylaluminum (TMAl) used as an aluminum source in the MOCVD process, and a nitrogen-containing gas as a nitrogen source, such as $NH_3$, may be used to form an aluminum-containing nitride film such as AlN.

As the nitrogen source, gas mixed with gas of at least one of $N_2$ and $H_2$ may be used together with $NH_3$. In addition, another group III metal source may be further used. For example, a gallium source such as trimethyl gallium (TMGa) or triethyl gallium (TEGa), and an indium (In) source such as trimethyl indium (TMIn), may be further used.

When the deposition process is performed at a high temperature, for example, 1000° C. or higher, a single crystal aluminum compound film may be obtained. For example, the process may be performed at a relatively low temperature, and a polycrystal or amorphous aluminum compound film may be formed. For example, the single crystal aluminum compound film may be obtained in a temperature range of about 1000° C. to about 1200° C. In a case in which the MOCVD process is performed, the aluminum source may be supplied to the process chamber under conditions of a flow rate of about 10 μmol/min to about 1000 μmol/min and a chamber pressure of about 60 Torr to about 500 Torr, and may react with a different source such as a nitrogen source, and an aluminum compound film may be formed.

The aluminum compound film formed in this process may be a polycrystalline or amorphous film as well as being a single crystal, and may be a complex in which two or more phases are mixed. Such an aluminum compound may have a relatively high level of stability, an undesired impurity element may be passivated, and disadvantageous effects, for example, due to the impurity element in a subsequent deposition process, may be reduced or prevented.

The impurity element may include, for example, oxygen. When the interior of the process chamber is exposed to external air, oxygen may remain in the process chamber or an internal surface thereof may be oxidized. An aluminum source and a nitrogen source may be supplied before a deposition process of depositing a single crystal film on a wafer, the occurrence of disadvantageous effects, for example, due to such oxygen, may be reduced or prevented, and an aluminum compound film may be formed on an inner surface of the process chamber. For example, the deposition process may be a process in which a nitride single crystal satisfying an empirical formula $Al_xIn_yGa_{1-x-y}N$ ($0<x\leq1$, $0\leq y\leq1$, $0<x+y\leq1$) is grown on the wafer for a light emitting device. Before such a deposition process, in the passivation process using the aluminum compound film, oxygen (O) present within the process chamber may be bonded to an Al component, oxygen that may act disadvantageously in a subsequent process may be passivated, and at least a portion of the aluminum compound film such as AlN may contain a resultant material bonded to oxygen.

After the aluminum compound is formed, a series of processes required in a single crystal thin film deposition process may be performed. First, in S14, a wafer may be disposed on a susceptor provided in the process chamber, and in subsequent operation S16, a thin film for a semiconductor device may be formed on the wafer.

According to a thin film to be deposited, a proper wafer may be selected and disposed. For example, when a nitride thin film is deposited, a MOCVD process may be performed. The wafer may be formed using a material selected from sapphire, SiC, Si, $MgAl_2O_4$, MgO, $LiAlO_2$, $LiGaO_2$, and GaN. The film deposited on the wafer may be a nitride semiconductor satisfying $Al_xIn_yGa_{1-x-y}N$ ($0<x\leq1$, $0\leq y\leq1$, $0<x+y\leq1$). The deposited film may be configured of a multilayer thin film, for example, may be a semiconductor laminate for a nitride semiconductor device. For example of the nitride semiconductor device, a stacking structure of a light emitting device configured to include a nitride semiconductor will be described in detail with reference to FIG. 5.

A specifically conductive, p-type or n-type, dopant may be added to a portion of layers of the semiconductor laminate. As the p-type dopant, magnesium (Mg) may be used, and as the n-type dopant, silicon (Si) may be used. For example, in the MOCVD process, as a magnesium gas for a p-type dopant, bis(cyclopentadienyl)magnesium ($Cp_2Mg$ or $(C_5H_5)_2Mg$) may be used, and as a silicon (Si) gas for an n-type dopant, silane ($SiH_4$) or disilane ($Si_2H_6$) gas may be used.

In the case of the deposition process for a nitride semiconductor device, the aluminum compound film formed in preceding operation S12 may contribute to stabilizing the formation process of a p-type nitride semiconductor layer. When a magnesium containing gas for a p-type dopant is supplied, oxygen remaining in the process chamber may be bonded to Mg, and it may disturb activation in a nitride semiconductor layer. In the exemplary embodiment of the present disclosure, residual oxygen may be passivated by forming an aluminum compound film before a deposition process, and disadvantageous effects may be reduced or prevented.

Figure 2:
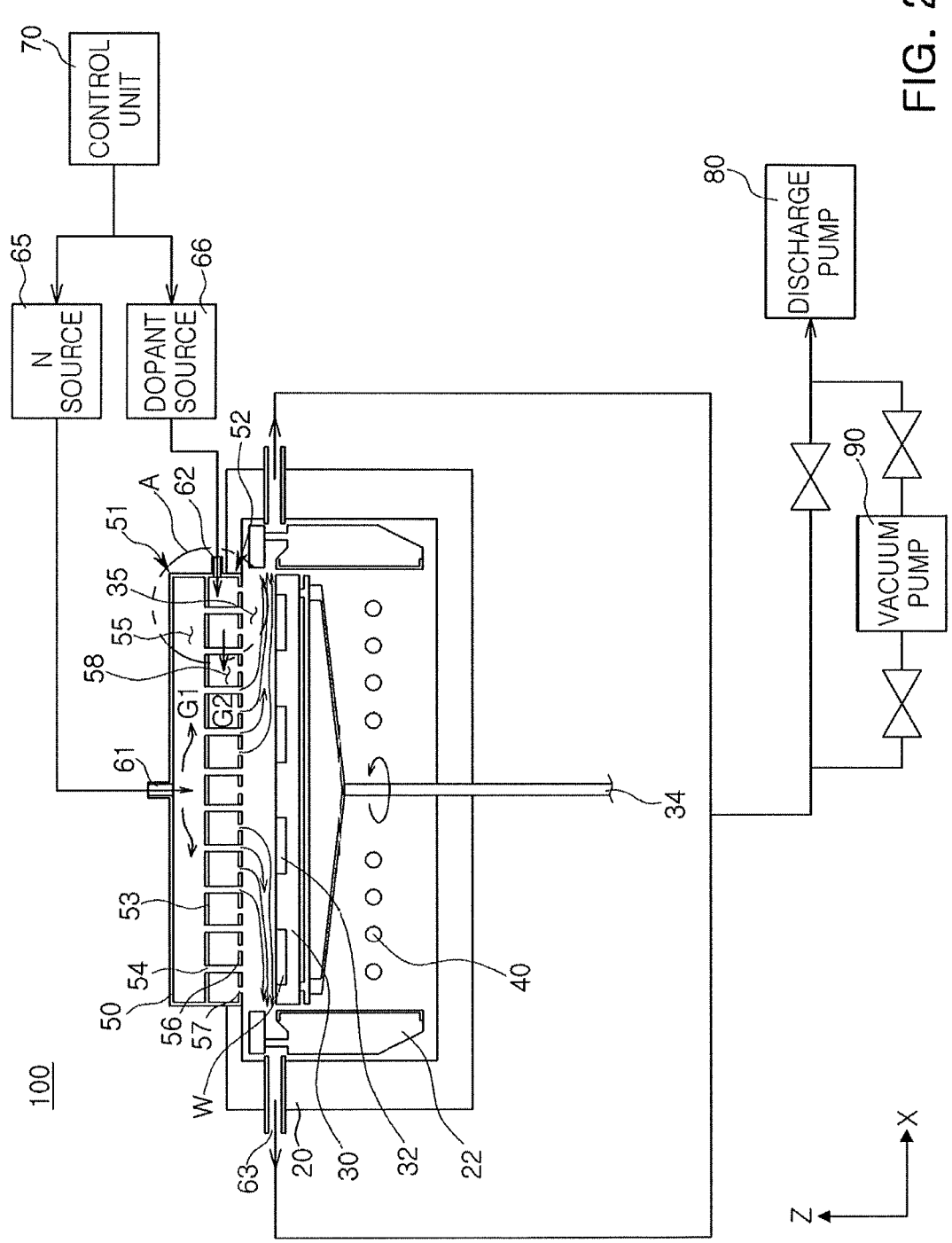
FIG. 2 illustrates a schematic view of an example of a thin film deposition apparatus used in the present disclosure.

FIG. 2 illustrates a schematic view of an MOCVD apparatus as an example of a thin film deposition apparatus used in the present disclosure.

A chemical vapor deposition apparatus 100 illustrated in FIG. 2 may include a process chamber 20 with an internal space having a predetermined size, a susceptor 30 rotatably installed in the process chamber 20, a heating unit 40 disposed below the susceptor 30, and a chamber cover 50 located in an upper part of the process chamber 20 to allow a reaction gas to be introduced thereinto.

The process chamber 20 may have a hollow internal space. The internal space may include a reaction space 35 in which a supplied source gas may react chemically in an upper part of the susceptor 30. The reaction space 35 may be provided between the chamber cover 50 and the susceptor 30. For example, a height of the reaction space 35 may be in a range of, for example, about 10 mm to about 20 mm.

The process chamber 20 may be formed using a metal having excellent abrasion resistance, heat resistance and anticorrosion properties. For example, such a material may be stainless steel (SUS). The chamber cover 50 and the susceptor 35 may also be formed using a material the same as or similar to that of the process chamber 20.

Figure 3:
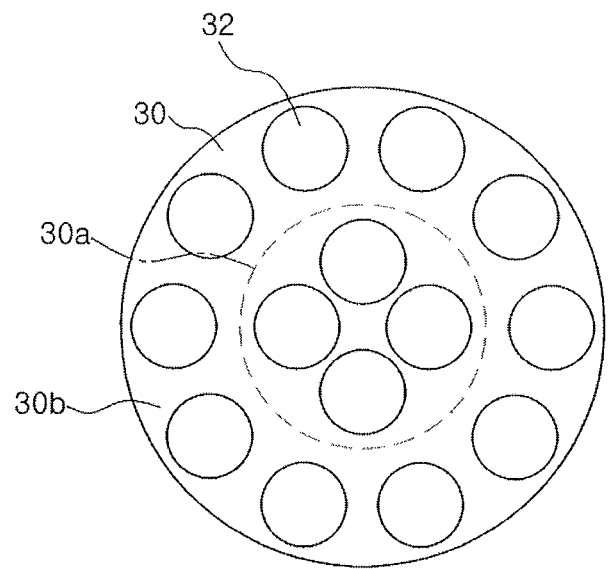
FIG. 3 illustrates a plan view of an example of a susceptor used in a thin film deposition apparatus illustrated in FIG. 2.

The susceptor 30 may be located in a central portion of the process chamber 20. A central axis of the internal space of the process chamber may substantially coincide with a rotary axis 34 of the susceptor 30. The susceptor 30 may have a pocket portion 32 having a concave shape in which a target deposition subject, a wafer W, is seated. The susceptor 30 may include a plurality of pocket portions 32. As illustrated in FIG. 3, the susceptor 30 may have an internal region 30a surrounded by an external region 30b, and may have a structure in which the internal region 30a includes four pocket portions and the external region 30b includes ten pocket portions.

The heating unit 40 may be disposed below the susceptor 30 to provide radiant heat to the susceptor 30. Such radiant heat may heat the wafer W mounted on the susceptor 30. The heating unit 40 may be a heat transmission member generating heat when power is applied thereto and may be arrayed in a region corresponding to the pocket 32 in the chemical vapor deposition apparatus. The heating unit 40 may be selected from an electric heater, a high frequency induction heater, an infrared radiation unit and a laser device.

The chamber cover 50 may have a structure allowing the process chamber 20 to be sealed as well as to maintain sealing thereof, and it may be opened and closed with respect to the process chamber 20. The chamber cover 50 may be provided in an upper portion of the process chamber 20 and may have a shower head-type spraying structure configured to dispense a source gas toward an upper part of the susceptor 30 rotating below the chamber cover 50 in a vertical manner.

The shower head-type spraying structure may include a first source supply portion 51 and a second source supply portion 52. The first source supply portion 51 may contain a first storage space 55 receiving a first source gas G1 introduced through a first intake pipe 61. The second gas supply portion 52 may contain a second storage space 58 receiving a second source gas G2 introduced through a second intake pipe 62.

A first cover member 53 may be disposed between the first storage space 55 and the second storage space 58. The first cover member 53 may include a plurality of first spraying pipes 54 dispensing the first source gas G1 introduced into the first storage space 55. The first spraying pipes 54 may penetrate the second storage space 58 and may be configured to dispense the first source gas G1 toward the upper part of the susceptor 30 in a vertical manner.

A second cover member 56 may be disposed between the second storage space 58 and the susceptor 30. The second cover member 56 may include a plurality of second spraying pipes 57 dispensing the second source gas G2 introduced into the second storage space 58. The second spraying pipes 57 may be configured to dispense the second source gas G2 toward the upper part of the susceptor 30 in a vertical manner, i.e.i, along a z-axis.

In a group III nitride semiconductor thin film deposition process, the first source gas G1 may be provided from a nitrogen source 65. For example, the nitrogen source 65 may be $NH_3$ gas or gas obtained by mixing $NH_3$ and at least one of $N_2$ and $H_2$. The second source gas G2 may be provided from a group III metal source or a dopant source 66. For example, a group III metal source may be at least one of trimethylaluminum (TMAl), trimethyl gallium (TMGa), triethyl gallium (TEGa) and trimethyl indium (TMIn). The dopant source may be a magnesium containing gas for a p-type dopant ($Cp_2Mg$ or $(C_5H_5)_2Mg$) or a silicon containing gas for an n-type dopant ($SiH_4$ or $Si_2H_6$). The group III metal or dopant source 66 may be supplied using a flow of at least one carrier gas from argon, nitrogen, hydrogen, helium, neon, xenon, and a combination thereof. The selection of a source necessary for a deposition process and the adjustment of a flow rate thereof while being supplied may be controlled by a source supply control unit 70.

In this shower head-type spraying structure, the first source gas G1 may be introduced into the first storage space 55 through the first gas intake pipe 61, and the introduced first source gas G1 may be introduced into the reaction space 35 through the first spraying pipe 54. The second source gas G2 may be introduced into the second storage space 58 through the second gas intake pipe 62, and the introduced second source gas G2 may be introduced into the reaction space 35 through the second spraying pipe 57. The first and second source gases G1 and G2 may chemically react in the reaction space 35 along a surface of the susceptor 30, and a resultant reaction material thereof, a thin film, may be deposited on a surface of the wafer W.

After the reaction, the residual first and second source gases G1 and G2 may flow from a center of the process chamber 20 in an outer circumferential direction thereof, i.e., along an x-direction, and may be externally exhausted through a gas discharge portion 63 provided on the outer circumferential side of the process chamber 20. Such a discharge process may be performed using a discharge pump 80. A vacuum forming pump 90 may be connected to the gas discharge portion 63, and the interior of the process chamber 20 may be vacuumed, for example, before a deposition process.

The chamber cover 50 may include a sealing member such as an O-ring to maintain airtight sealing of the process chamber at the time of coupling the chamber cover to the process chamber. The entirety of the first cover member 53 and the second cover member 56 may have a circular shape corresponding to that of the chamber cover 50, and may be configured to be detachable from the chamber cover 50. The first cover member 53 and the second cover member 56 may be replaced with new members in the case of the occurrence of errors therein.

While the first cover member 53 and the second cover member 56 may be configured of a single member, the first cover member 53 and the second cover member 56 may also be formed by coupling a plurality of divided members to each other according to an exemplary embodiment of the present disclosure. Only divided members having errors occurring therein may be selectively replaced, and a maintenance process may be simplified.

The first cover member 53 and the second cover member 56 may contain a material having excellent heat resistance, for example, quartz or graphite coated with silicon carbide (SiC).

Figure 4:
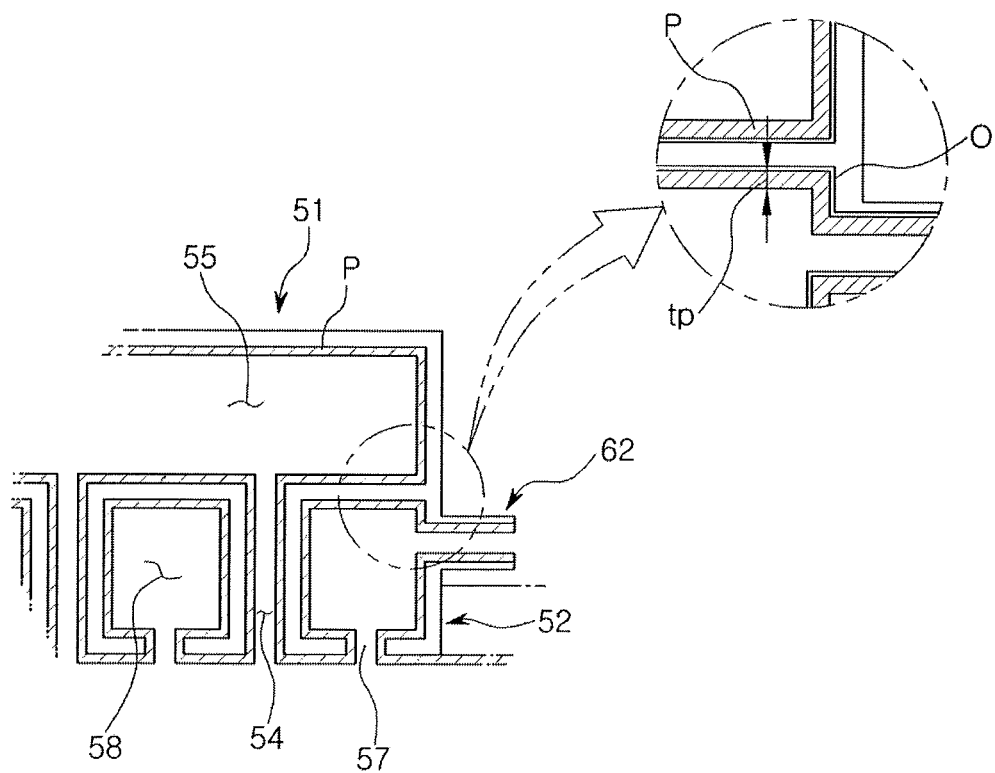
FIG. 4 illustrates a partially enlarged view of the thin film deposition apparatus illustrated in FIG. 2.

As described in the foregoing process, in the case of the thin film deposition apparatus 100, an aluminum compound film may at least be formed on an inner surface of the process chamber and in a region thereof into which a source is introduced, before a deposition process. FIG. 4 is an enlarged view of the thin film deposition apparatus 100, taken from portion "A" of FIG. 2.

FIG. 4 illustrates a portion of a shower head-type spraying structure located in the vicinity of the second intake pipe 62.

As illustrated in FIG. 4, an aluminum compound film P may be formed on surfaces of the first source supply portion 51 and the second source supply portion 52 configuring the shower head-type spraying structure together with the intake pipe 62. The aluminum compound film P may be formed on the surface provided as a passage of the source spraying structure on which a source flows.

The aluminum compound film P may be formed using an aluminum-containing nitride such as AlN. In the case of such an aluminum compound, since AlN has a relatively high level of thermal stability and is configured of a source used in a MOCVD process for a nitride semiconductor device, the aluminum compound film P may be formed using the aluminum-containing nitride such as AlN. The aluminum compound film P may be formed by supplying an Al source through the second intake pipe 62 and a nitrogen-containing gas such as $NH_3$ through the first intake pipe 61, and may react and then be formed.

This aluminum compound film may passivate impurities such as oxygen present within the process chamber before the deposition process. For example, when the interior of the process chamber is exposed to external air, oxygen may be introduced into the process chamber to cause an internal surface thereof to be oxidized. For example, in a case in which a chamber member such as the process chamber 30 is formed using an oxidizable material such as SUS, the internal surface of the chamber member may be oxidized even in the case of slight exposure. Oxygen present on such an oxidized surface O may react disadvantageously in the deposition process. Oxygen may react with a dopant such as Mg to disturb activation of the dopant.

The aluminum compound film, such as an AlN film provided before the deposition process, may be bonded to oxygen (O) present on the internal surface of the process chamber, exhibit passivation effects may be exhibited, and oxygen may not disadvantageously react in a subsequent process. An aluminum source for the aluminum compound film may be supplied through the same passage as a passage through which a p-type dopant gas is supplied, and disadvantageous effects of oxygen on the p-type dopant may be reduced or prevented.

In such a passivation process, at least a portion of the aluminum compound film such as an AlN film may contain a resultant material bonded to oxygen. As illustrated in FIG. 4, on the internal wall surfaces, an aluminum oxide "O" may be formed as Al arrives on an oxidized surface thereof, and an aluminum nitride "P" may be formed on the aluminum oxide "O". A compound formed, for example, due to a combination of aluminum and oxygen, may be partially detected on the aluminum compound film and the surfaces on which the aluminum compound film is formed, before a deposition process.

Although the exemplary embodiment of the present disclosure provides a uniform thickness in the entirety of regions thereof, a non-uniform thickness may be actually applied thereto, and a region in which the aluminum compound film is partially unformed may be present. In the case of the aluminum-containing nitride film, a thickness of the film tp may be in a range of 10 to 10,000 nm, for example, 1 µm or more.

Figure 5:
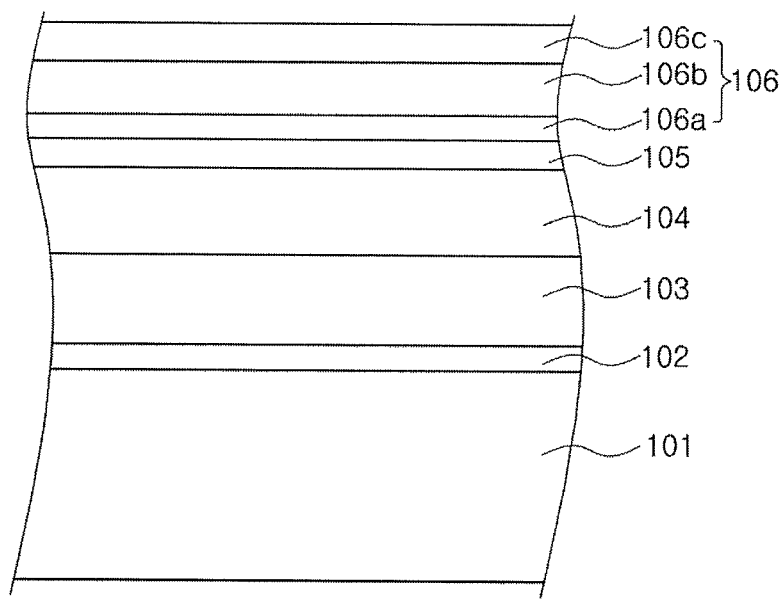
FIG. 5 illustrates a cross-sectional view of an example of a nitride semiconductor device manufactured as a semiconductor device according to an exemplary embodiment of the present disclosure.

The MOCVD process may be used for use in a nitride semiconductor device, for example, a nitride semiconductor light emitting device. FIG. 5 is a cross-sectional view of a nitride semiconductor light emitting device 110 for example of a semiconductor device.

The nitride semiconductor light emitting device 110 illustrated in FIG. 5 may include a substrate 101 and a semiconductor laminate disposed on the substrate 101. A buffer layer 102 may be interposed between the semiconductor laminate and the substrate 101. The semiconductor laminate may include an undoped nitride layer 103, an n-type nitride semiconductor layer 104, an active layer 105, and a p-type nitride semiconductor layer 106.

The substrate 101 may be an element corresponding to a wafer at a deposition process level, and may be an insulating, conductive or semiconductor substrate. For example, the substrate 101 may be formed using sapphire, SiC, Si, $MgAl_2O_4$, MgO, $LiAlO_2$, $LiGaO_2$, or GaN.

The buffer layer 102 may be represented by empirical formula $Al_xGa_{1-x}N$ ($0 \leq x \leq 1$). For example, the substrate 101 may be a silicon (Si) substrate, and the buffer layer 102 may have a stacking structure in which two or more layers having different compositions are repeatedly stacked a plurality of times. This will be described in detail with reference to FIGS. 7 to 11.

The undoped nitride layer 103 may be an undoped layer represented by $Al_xIn_yGa_{1-x-y}N$ ($0 < x \leq 1$, $0 \leq y < 1$, $0 \leq x+y < 1$). The n-type nitride semiconductor layer 104 may be represented by n-type $Al_xIn_yGa_{1-x-y}N$ ($0 \leq x < 1$, $0 \leq y < 1$, $0 \leq x+y < 1$), and an n-type dopant may be Si. The n-type nitride semiconductor layer 104 may have a multilayer structure satisfying n-type $Al_xIn_yGa_{1-x-y}N$ ($0 \leq x < 1$, $0 \leq y < 1$, $0 \leq x+y < 1$). For example, the n-type nitride semiconductor layer 104 may have a super-lattice structure. One layer in such a super-lattice layer may have a thickness of from about 1 nm to about 20 nm.

The active layer 105 may have a multiple quantum well (MQW) structure in which quantum well layers and quantum barrier layers are alternately stacked, for example, a GaN/InGaN structure in the case of a nitride semiconductor. The active layer 105 may also have a single quantum well (SQW) structure. The p-type nitride semiconductor layer 106 may be a nitride semiconductor layer satisfying p-type $Al_xIn_yGa_{1-x-y}N$ ($0 \leq x < 1$, $0 \leq y < 1$, $0 \leq x+y < 1$), and a p-type dopant may be Mg. For example, the p-type nitride semiconductor layer 106 may include a p-AlGaN electron blocking layer 106a, a p-GaN layer 106b, and p+-contact layer 106c.

In the MOCVD process, the respective nitride semiconductor layer may be obtained by supplying a proper source gas (precursor) to then be formed through a chemical reaction thereof. For example, in the case of a nitride semiconductor of a single crystal, a wafer has a temperature range of about 800° C. to about 1200° C., and a gallium source, for example, TMGa, and a nitrogen-containing source, for example, $NH_3$, are supplied to react with each other, and a GaN layer of a single crystal may be deposited. As the gallium source and indium source, for example, TMIn and a nitrogen-containing source may be supplied to react with each other, an InGaN layer may be deposited, and in addition, an AlGaN layer may be deposited by supplying an aluminum source, for example, TMAl. Dopants such as silicon (Si) or magnesium (Mg) may be added to the thin film. For example, as a silicon dopant, a silane ($SiH_4$) or disilane (Si$_2$H$_6$) gas may be used, and as a magnesium dopant, bis(cyclopentadienyl)magnesium(Cp$_2$Mg or (C$_5$H$_5$)$_2$Mg) may be used.

Figure 6:
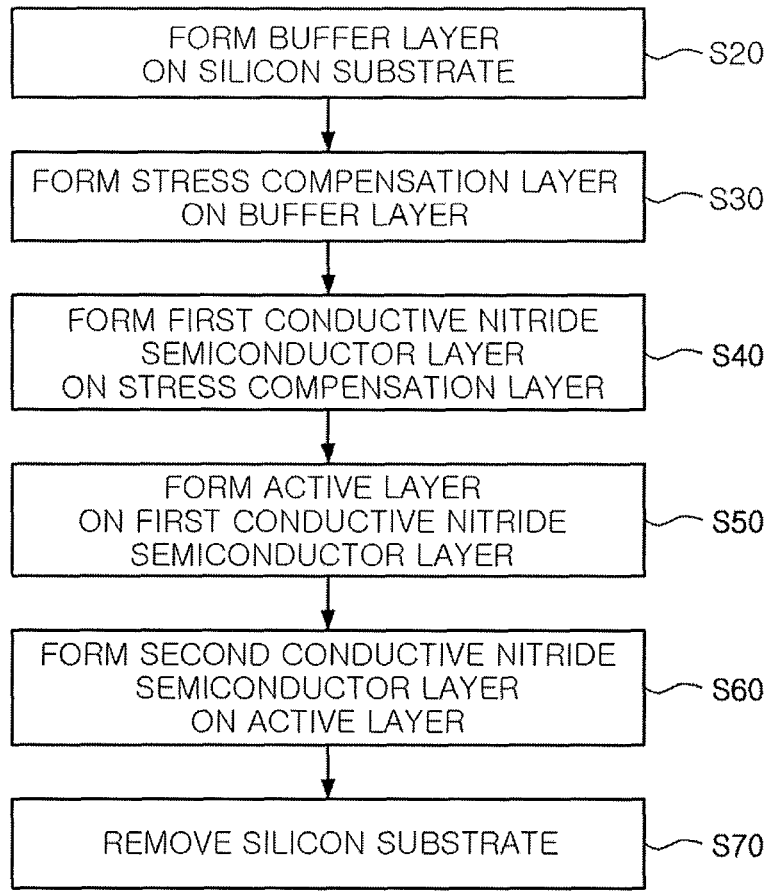
FIG. 6 illustrates a process flow chart of an example of a method of manufacturing a nitride semiconductor light emitting device.

FIG. 6 illustrates a process flow chart of an example of a method of manufacturing a nitride semiconductor light emitting device.

The method of manufacturing a nitride semiconductor light emitting device may include growing a nitride semiconductor single crystal on a silicon substrate. Before the deposition process, a process of forming an aluminum compound film on an inner surface of a process chamber by supplying an aluminum (Al) source gas to the process chamber may be performed.

In S20, a buffer layer may be formed on the silicon substrate. The buffer layer may be formed on the plane 111 of the silicon substrate. The buffer layer may be configured of one or more layers. The buffer layer may, for example, include an AlN core growth layer and an AlGaN lattice buffer layer. The lattice buffer layer may be configured of a single layer or a plurality of layers. For example, the lattice buffer layer may be a (graded) Al$_x$In$_y$Ga$_{1-x-y}$N (0≤x, y≤1, x+y≤1) or Al$_{x1}$In$_{y1}$Ga$_{1-x1-y1}$N/Al$_{x2}$In$_{y2}$Ga$_{1-x2-y2}$N (0≤x1, x2, y1, y2≤1, x1≈x2 or y1≈y2, x1+y1≤1, x2+y2≤1) super-lattice layer, in which a partial AlGaN or Al-like ingredient content is increased or reduced linearly or in stepwise fashion. For example, the lattice buffer layer may have a structure in which AlGaN and AlN are alternately stacked. For example, the lattice buffer layer may have a tri-layer structure of AlGaN/AlN/AlGaN. In this process, when the lattice buffer layer is grown at a relatively high temperature, a volume fraction of hydrogen in the nitrogen source gas may be maintained at a relatively low level of about 40% or less (for example, 35% or less) and a growth temperature may be lowered to about 1040° C. or less within a range allowing for a high quality crystal to be grown, and the occurrence of melt-back defects may be suppressed.

Subsequently, in S30, a stress compensation layer may be formed on the buffer layer. The stress compensation layer may have a multiple-layer structure for controlling tensile stress at the time of cooling while relieving compressive stress generated during a growth process. For example, the stress compensation layer may be disposed on the buffer layer, and may include a first nitride semiconductor layer disposed on the buffer layer and having a lattice constant greater than that of the buffer layer, an intermediate layer disposed on the first nitride semiconductor layer and having a lattice constant lower than that of the first nitride semiconductor layer, and a second nitride semiconductor layer having a lattice constant greater than that of the intermediate layer. As such a stress compensation layer, various stacking structures (see FIGS. 7 to 10) may be applied thereto.

In this process, the volume fraction of hydrogen in the nitrogen source gas may be maintained at a low level of about 40% or less (for example, 35% or less), a high quality crystal may be grown at a relatively low temperature of about 1050° C. or less, and a degree of bowing of a wafer may be reduced by decreasing compressive stress at the time of growth together with suppression of a melt-back phenomenon, in other words, with curvature reduction effects.

Then, in S40, a first conductive nitride semiconductor layer may be formed on the stress compensation layer, and subsequently, in S50, an active layer may be formed on the first conductive nitride semiconductor layer.

The first conductive nitride semiconductor layer may be a nitride semiconductor satisfying n-type Al$_x$In$_y$Ga$_{1-x-y}$N (0≤x<1, 0≤y≤1, 0≤x+y<1), and an n-type dopant may be Si. For example, the first conductive nitride semiconductor layer may be n-type GaN. The active layer may have a multiple quantum well (MQW) structure in which quantum well layers and quantum barrier layers are alternately stacked, for example, a GaN/InGaN structure in the case of a nitride semiconductor. The active layer may also have a single quantum well (SQW) structure.

In the growth process of S50, the degree of wafer bowing occurring, for example, due to compressive stress during the growth process, may also be reduced by decreasing the fraction of hydrogen in the nitrogen source gas as in the case of the preceding process, and this may have advantageous effects on active layer characteristics. By reducing curvature of the first conducive nitride semiconductor layer surface provided as a growth surface of the active layer, a thickness deviation in the active layer depending on respective positions thereof may be reduced. For example, when the curvature is relatively great, the thickness deviation of the active layer (for example, the quantum well layer) may be large in an edge and a center of the wafer, and wavelength properties may be changed depending on regions of the wafer. In the exemplary embodiment of the present disclosure, a problem, for example, due to wafer bowing, may be reduced by lowering the fraction of hydrogen in the nitrogen source gas to decrease a growth temperature.

In S60, a second conductive nitride semiconductor layer may be formed on the active layer. The second conductive nitride semiconductor layer may be a nitride semiconductor layer satisfying p-type Al$_x$In$_y$Ga$_{1-x-y}$N (0≤x<1, 0≤y<1, 0≤x+y<1), and the p-type dopant may be Mg. For example, the second conductive nitride semiconductor layer may be a p-type AlGaN/GaN layer.

In S70, the silicon substrate may be removed. As in the exemplary embodiment of the present disclosure, in the case of a light emitting device, the silicon substrate may absorb light to deteriorate light emission efficiency, and a scheme for suppressing the absorption of light in the silicon substrate may further be necessary. For example, a silicon substrate may be removed as in the exemplary embodiment of the present disclosure. Before the process of removing the silicon substrate, a process of providing a surface opposing the surface on which the silicon substrate is located with a permanent substrate may further be added.

Figure 7:
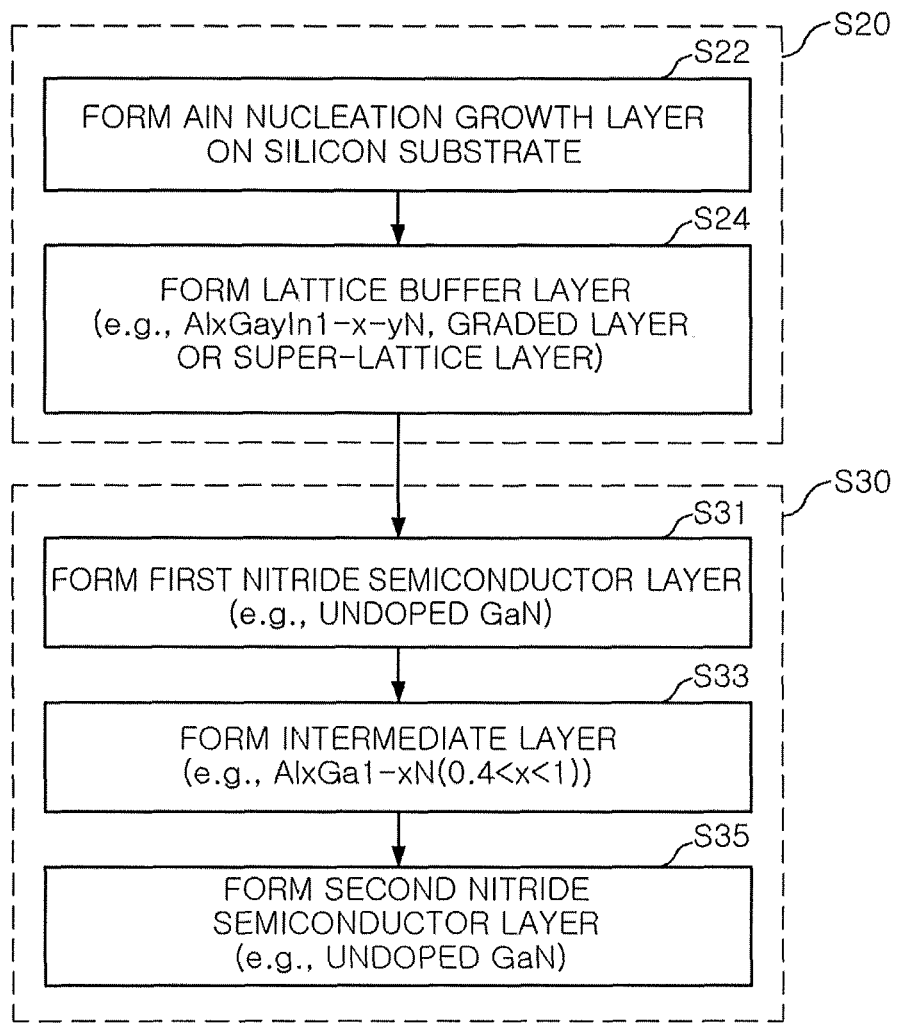
FIG. 7 illustrates a process flow chart of an example of a buffer structure forming process in the method of manufacturing a nitride semiconductor light emitting device illustrated in FIG. 6.

FIG. 7 illustrates a process flow chart of an example of a buffer structure forming process in the method of manufacturing a nitride semiconductor light emitting device of FIG. 6. Before the process of FIG. 7, an aluminum source may be supplied to the interior of the process chamber, and an aluminum compound film may be formed on an internal surface of the process chamber. After forming the aluminum compound film, a wafer, a silicon substrate, may be disposed, and subsequent processes may then be performed.

As illustrated in FIG. 7, the formation of the buffer layer on the silicon substrate in S20 may include forming a nucleation growth layer in S22 and forming a lattice buffer layer disposed on the nucleation growth layer in S24.

The formation of the buffer layer according to the exemplary embodiment of the present disclosure may be initiated by forming a nucleation growth layer on a silicon substrate in S22.

The nucleation growth layer may be formed on the plane 111 of the silicon substrate. The nucleation growth layer may provide a growth surface improved in terms of wettability thereof. For example, the nucleation growth layer may be an AlN layer. The nucleation growth layer may prevent the occurrence of a melt-back phenomenon forming a eutectic metal through a reaction of silicon of the substrate and gallium of a nitride single crystal. The AlN nucleation growth layer may be formed through an initial operation of injecting an aluminum source such as trimethylaluminum. The initial injection of such an Al source may prevent the silicon substrate from being first exposed to ammonia and nitrified. For example, the nucleation growth layer may have a size of tens of nm to hundreds of nm.

Subsequently, in S24, a lattice buffer layer may be formed on the nucleation growth layer. The lattice buffer layer may form a dislocation loop in an interface thereof with a nitride crystal to be subsequently grown, and a dislocation density may be reduced. The lattice buffer layer may relax lattice mismatching with a nitride single crystal to be subsequently grown and thermal expansion coefficient mismatching thereof, effective generation of compressive stress at the time of crystal growth may be allowed, and tensile stress occurring at the time of cooling may be reduced. The lattice buffer layer may be configured of a nitride crystal containing Al and may be configured of a single layer or a plurality of layers. For example, the lattice buffer layer may be a (graded) $Al_x In_y Ga_{1-x-y} N$ ($0 \le x$, $y \le 1$, $x+y \le 1$) or $Al_{x1} In_{y1} Ga_{1-x1-y1} N / Al_{x2} In_{y2} Ga_{1-x2-y2} N$ ($0 < x1$, $x2$, $y1$, $y2 \le 1$, $x1 \approx x2$, or $y1 \approx y2$, $x1+y1 \le 1$, $x2+y2 \le 1$) super-lattice layer, in which a partial AlGaN or Al-like ingredient content is increased or reduced linearly or in stepwise fashion. For example, the lattice buffer layer may have a structure in which AlGaN and AlN are alternately stacked. For example, the lattice buffer layer may have a tri-layer structure of AlGaN/AlN/AlGaN.

The lattice buffer layer may be grown in a temperature range of 700 to 1040° C. However, since the lattice buffer layer is adjacent to the silicon substrate, melt-back may be sensitively affected thereby. In consideration of such an influence, a growth temperature may be maintained at a relatively low temperature. For example, the lattice buffer layer may be grown at a temperature of about 1010° C. or less.

Various examples of such a buffer layer will be described in further detail with reference to FIGS. 8 to 11.

Operation S30 in which the nitride single crystal is formed may include operations S31, S3,3 and S35 of sequentially forming a first nitride semiconductor layer, an intermediate layer and a second nitride semiconductor layer on the lattice buffer layer.

Operation S30 of forming the nitride single crystal may be initiated by operation S31 of forming the first nitride semiconductor layer on the lattice buffer layer.

The first nitride semiconductor layer may be a nitride crystal having a lattice constant greater than that of the lattice buffer layer. The first nitride semiconductor layer may contain $Al_x In_y Ga_{1-x-y} N$ ($0 \le x$, $y \le 1$, $x+y < 1$). For example, the first nitride semiconductor layer may be a GaN layer.

The first nitride semiconductor layer may receive compressive stress at an interface thereof with the lattice buffer layer, and at the time of cooling thereof at a room temperature after completing the growth process, tensile stress may occur, for example, due to a difference in thermal expansion coefficients between the substrate and the first nitride semiconductor layer. The intermediate layer may be formed on the first nitride semiconductor layer in S33, and such stress may be compensated for. The intermediate layer may be a nitride crystal having a lattice constant lower than that of the first nitride semiconductor layer. For example, the intermediate layer may be an $Al_x Ga_{1-x} N$ ($0.4 < x < 1$) layer.

Subsequently, in S35, a second nitride semiconductor layer may be formed on the intermediate layer. The second nitride semiconductor layer may have a relatively high level of compressive stress. Relatively weak compressive stress or tensile stress applied to the first nitride semiconductor layer may be compensated by the compressive stress of the second nitride semiconductor layer, and the occurrence of cracks may be reduced. The second nitride semiconductor layer may contain $Al_x In_y Ga_{1-x-y} N$ ($0 \le x$, $y \le 1$, $x+y < 1$), similar to the first nitride semiconductor layer. For example, the GaN layer used as the first and second nitride semiconductor layers may be undoped GaN layers.

In an example, a nitride laminate including at least one nitride semiconductor layer may be further formed on the second nitride semiconductor layer. Such a nitride semiconductor layer may be formed using $Al_x In_y Ga_{1-x-y} N$ ($0 \le x$, $y \le 1$, $x+y \le 1$) and may be an undoped layer or a layer doped with n-type and/or p-type dopants. For example, the nitride semiconductor layer may be a plurality of semiconductor layers provided as an element performing a specific function.

The nitrogen source gas used in the deposition process may contain hydrogen ($H_2$) together with $NH_3$ and $N_2$. The volume fraction of a hydrogen gas in the nitrogen source gas may be about 40% or less.

The nitride growth process by such a relatively low volume fraction control of hydrogen may be applied to the entirety of the formation process S30 of a nitride crystal or may be partially applied thereto.

Additionally, the nitride crystal growth under the relatively low volume fraction of hydrogen may be advantageously applied to other operations for a nitride crystal growth at a high temperature to obtain a high quality crystal, as well as to the formation procedure S30 of the nitride crystal. For example, the nitride crystal growth under the relatively low volume fraction of hydrogen may be applied to the process S24 of forming the lattice buffer layer in the buffer layer formation process and/or the process of forming at least one nitride semiconductor layer on the second nitride semiconductor layer.

An excellent quality crystal may be maintained while lowering a growth temperature in respective operations by a predetermined level, for example, about 20° C. to about 30° C., through the relatively low volume fraction control of hydrogen. For example, a high quality nitride crystal may be obtained even when the nitride crystal growth temperature is about 1040° C. or less.

The reduction in the growth temperature, obtained through the low hydrogen fraction control in the nitrogen source gas may reduce a problem of transformation, for example, due to a difference in thermal expansion coefficients, and a problem of deviation in thin film thicknesses, for example, due to the occurrence of bowing during the growth process, may be reduced. Considerable effects for largely reducing the occurrence of melt-back defects may be expected.

FIGS. 8 to 11 illustrate cross-sectional views of various examples of structures of a buffer layer and a stress compensation layer according to an exemplary embodiment of the present disclosure.

Figure 8:
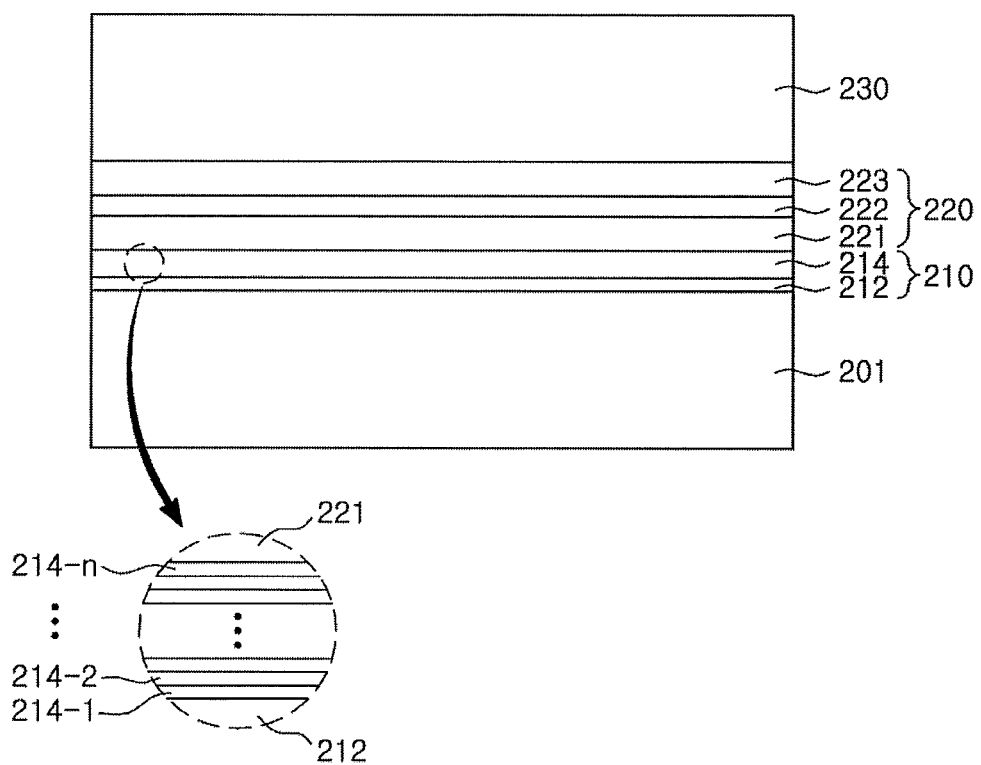
FIGS. 8 to 11 illustrate cross-sectional views of a buffer layer and a stress compensation layer according to various examples.

As illustrated in FIG. 8, a buffer layer 210, a stress compensation layer 220, and a nitride laminate 230 may be sequentially disposed on a silicon substrate 201.

The silicon substrate 201 may include a substrate partially containing a silicon material as well as a substrate formed using a silicon material. For example, a silicon-on-insulator (SOI) substrate may be used. An upper surface of the silicon substrate 201 may be the plane (111).

The buffer layer 210 may include a nucleation growth layer 212 disposed on the silicon substrate 201 and the lattice buffer layer 214 disposed on the nucleation growth layer 212.

The nucleation growth layer 212 may be an AlN layer. The nucleation growth layer 212 may be provided to prevent a melt-back phenomenon. The nucleation growth layer 212 may provide a growth surface improved in terms of wettability, and may be advantageous to the growth of crystal. For example, the nucleation growth layer 212 may have the size of tens to hundreds of nm.

The lattice buffer layer 214 may reduce defects by bending penetration potential. As the thickness of the lattice buffer layer 214 is increased, the compressive stress relaxation in a first nitride semiconductor layer 221 grown subsequently may be decreased and defects may be reduced. The lattice buffer layer 214 may have a thickness of hundreds nm to several μm.

Although the lattice buffer layer 214 may have a single composition, the lattice buffer layer 214 may be a graded layer of $Al_xIn_yGa_{1-x-y}N$ (0≤x, y≤1, x+y≤1) as illustrated in FIG. 4. The graded structure employed in the exemplary embodiment of the present disclosure may include a plurality of layers (214-1, 214-2, . . . , and 214-n). The plurality of layers (214-1, 214-2, . . . , and 214-n) may have a step-graded structure in which Al compositions are sequentially reduced. The lattice buffer layer 214 having the graded structure may be implemented by AlGaN based on a three component system, adjusting an Al composition. In another example, the lattice buffer layer may have a linearly graded structure instead of a step-graded structure.

This lattice buffer layer 214 may gradually reduce lattice mismatching between the AlN nucleation growth layer 212 and the first nitride semiconductor layer 221. The lattice buffer layer 214 may generate compressive stress at the time of crystal growth, and tensile stress occurring at the time of cooling may be reduced.

The stress compensation layer 220 may include a first nitride semiconductor layer 221, an intermediate layer 222, and a second nitride semiconductor layer 223 sequentially disposed on the lattice buffer layer 214.

The first nitride semiconductor layer 221 may be a nitride crystal having a lattice constant greater than that of the lattice buffer layer 223. The first nitride semiconductor layer 221 may contain $Al_xIn_yGa_{1-x-y}N$ (0≤x, y≤1, x+y<1), and may be a GaN layer. The first nitride semiconductor layer 221 may receive compressive stress at an interface thereof with the lattice buffer layer 214.

Such compressive stress may be relaxed as the thickness of the first nitride semiconductor layer 221 is increased. When the thickness (about 2 μm or more) of the first nitride semiconductor layer 221 is increased, it may be difficult to control tensile stress occurring, for example, due to a difference in thermal expansion coefficients between the substrate 201 and the first nitride semiconductor layer 221 at the time of cooling at a room temperature after completing the growth process. Furthermore, cracks may occur.

The intermediate layer 222 may be disposed on the first nitride semiconductor layer 221, and tensile stress occurring at the time of cooling may be compensated for. The intermediate layer 222 may be configured of a nitride crystal having a lattice constant lower than that of the first nitride semiconductor layer 221. For example, the intermediate layer 222 may be a layer represented by $Al_xGa_{1-x}N$ (0.4<x<1).

The second nitride semiconductor layer 223 may be disposed on the intermediate layer 222. The second nitride semiconductor layer 223 may have compressive stress. The compressive stress of the second nitride semiconductor layer 223 may compensate for a relatively low level of compressive stress or tensile stress applied to the first nitride semiconductor layer 221, and the occurrence of cracks may be suppressed. The second nitride semiconductor layer 223 may contain $Al_xIn_yGa_{1-x-y}N$ (0≤x, y≤1, x+y<1), similar to the case of the first nitride semiconductor layer 221. For example, the second nitride semiconductor layer 223 may be a GaN layer. At least one of the first and second nitride semiconductor layers 221 and 223 may be, for example, an undoped nitride layer.

The nitride laminate 230 may be disposed on the second nitride semiconductor layer 223. The nitride laminate 230 may contain at least one nitride semiconductor layer formed using $Al_xIn_yGa_{1-x-y}N$ (0≤x, y≤1, x+y≤1). The at least one nitride semiconductor layer may be an undoped layer, or a nitride layer doped with n-type dopant or p-type dopant. For example, the nitride laminate may be a plurality of nitride semiconductor layers for a device for performance of a specific function, for example, a semiconductor light emitting device.

Such a restrictive supply scheme of hydrogen gas may also be used in all nitride crystal growth processes requiring high temperature growth according to the exemplary embodiment of the present disclosure. For example, the restrictive supply scheme of hydrogen gas may be applied to all of a growth process of the stress compensation layer 220 including the first nitride semiconductor layer 221, the intermediate layer 222, and the second nitride semiconductor layer 223, together with a growth process of the lattice buffer layer 214, and in addition, the scheme may only be selectively applied to at least a portion of sections in the growth processes. For example, the scheme may be used in a single crystal growth process requiring high temperature growth as in a growth process for a GaN crystal. The restrictive supply scheme of hydrogen gas may be applied to a portion of a growth process of the nitride laminate 230.

Figure 9:
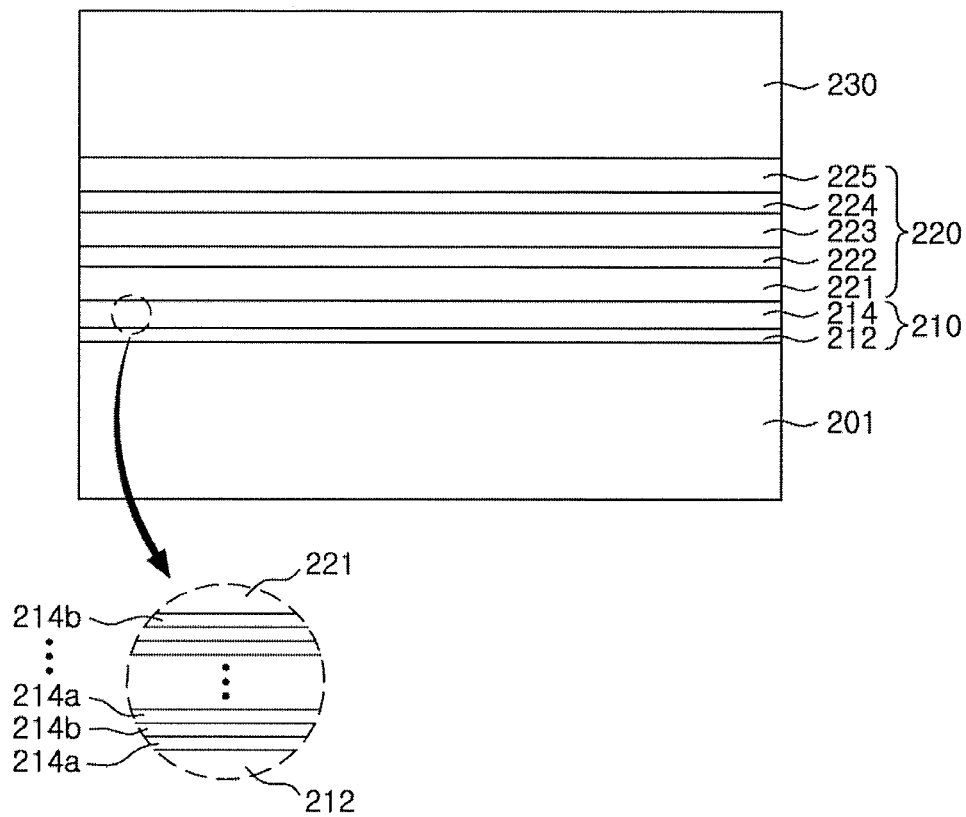

With reference to FIG. 9, similar to the case of FIG. 8, a buffer layer 210, a stress compensation layer 220 and a nitride laminate 230 are sequentially disposed on a silicon substrate 201.

Constituent elements of FIG. 9, the same as those of FIG. 8, may be understood as being identical or similar to those of FIG. 8 described above according to the foregoing exemplary embodiment of the present disclosure, and the descriptions with respect to FIG. 8 may be combined with a description of the exemplary embodiment of FIG. 9.

Similar to the buffer layer 210 illustrated in FIG. 8, the buffer layer 210 with reference to FIG. 9 may include an AlN nucleation growth layer 212 and a lattice buffer layer 214'. The lattice buffer layer 214' used in the exemplary embodiment of the present disclosure may have a structure different from that of the lattice buffer layer 214 illustrated in FIG. 8.

The lattice buffer layer 214' may have a super-lattice structure in which, for example, two or more layers 214a and 214b having different compositions are alternately stacked. For example, the lattice buffer layer 214' may be a $Al_{x1}In_{y1}Ga_{1-x1-y1}N/Al_{x2}In_{y2}Ga_{1-x2-y2}N$ (0≤x1, x2, y1, y2≤1, x1≈x2 or y1≈y2, x1+y1≤1, x2+y2≤1) layer. The lattice buffer layer 214' using the super-lattice structure as in the present exemplary embodiment of the present disclosure may also reduce stress between the silicon substrate 201 and the first nitride semiconductor layer 221.

The stress compensation layer 220 used in the present exemplary embodiment of the present disclosure may further include a second intermediate layer 224 and a third nitride semiconductor layer 225, in addition to the first and second nitride semiconductor layers 221 and 223 illustrated in FIG. 8, and a first intermediate layer 222 disposed therebetween.

The second intermediate layer 224 and the third nitride semiconductor layer 225 may be understood as having functions similar to those of the first intermediate layer 222 and the second nitride semiconductor layer 223. For example, the second intermediate layer 224 may be disposed on the second nitride semiconductor layer 223 to compensate for tensile stress occurring at the time of cooling. The second intermediate layer 224 may be configured of a nitride crystal having a lattice constant lower than that of the second nitride semiconductor layer 224. For example, the second intermediate layer 224 may be an $Al_xGa_{1-x}N$ (0.4<x<1) layer.

The third nitride semiconductor layer 225 may be disposed on the second intermediate layer 224. The third nitride semiconductor layer 225 may have compressive stress. The compressive stress of the third nitride semiconductor layer 225 may compensate for a relatively low level of compressive stress or tensile stress applied to the first and second nitride semiconductor layers 221 and 223 located below the third nitride semiconductor layer 225, and the occurrence of cracks may be suppressed.

The third nitride semiconductor layer 225 may contain $Al_xIn_yGa_{1-x-y}N$ (0≤x, y≤1, x+y<1), similar to the case of the second nitride semiconductor layer 223. For example, the third nitride semiconductor layer 225 may be a GaN layer.

Figure 10:
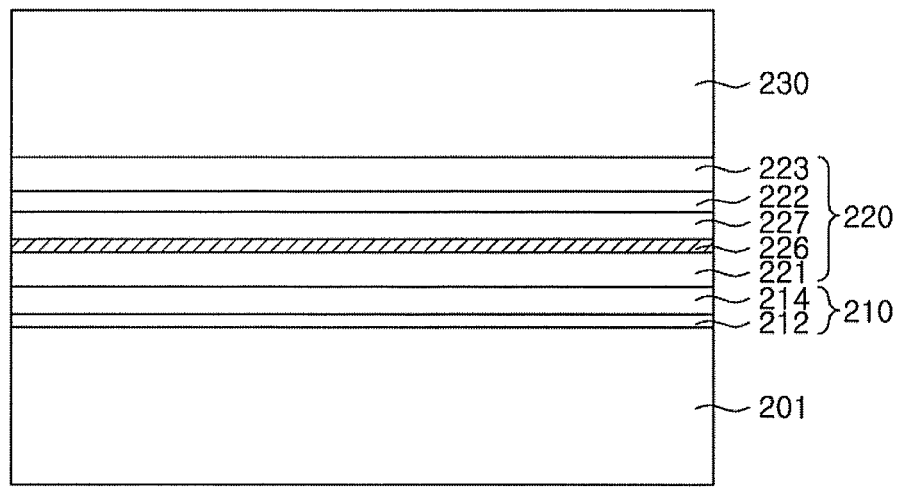

With reference to FIG. 10, similar to the case of FIG. 8, a buffer layer 210, a stress compensation layer 220 and a nitride laminate 230 are sequentially disposed on a silicon substrate 201. Unlike the example illustrated in FIG. 8, the example of FIG. 10 may include a mask layer 226 and a coalescence nitride layer 227 formed on the mask layer 226.

The mask layer 226 may be disposed on the first nitride semiconductor layer 221.

The majority of threading dislocations from the first nitride semiconductor layer 221 may be blocked by the mask layer 226, the remaining threading dislocation may also be bent by the coalescence nitride layer 227 grown subsequently, and a dislocation density of the subsequently grown nitride crystal may be reduced. A thickness and dislocation density of the coalescence nitride layer 227 may be changed depending on growth conditions, for example, variables such as temperature, pressure, and a mole composition ratio of V/III sources.

The mask layer 226 may be formed using silicon nitride ($SiN_x$) or titanium nitride (TiN). For example, a $SiN_x$ mask layer 226 may be formed using silane ($SiH_4$) and ammonia gas. The mask layer 226 may not necessarily completely cover a surface of the first nitride semiconductor layer 221, an exposure region of the first nitride semiconductor layer 221 may be determined on a degree to which the mask layer 226 covers the first nitride semiconductor layer 221, and an initial island growth form of a nitride crystal grown thereon may be changed. For example, when an area of the exposed nitride semiconductor layer is reduced by increasing the mask region of $SiN_x$, a density of an initial island of the nitride layer 227 to be grown on the mask layer 226 is reduced, while the size of coalescing islands may be relatively increased, and a thickness of the coalescence nitride layer 227 may also be increased.

When the mask layer 226 is added, stress between nitride semiconductor layers may be decoupled by the mask layer, and compressive stress transferred to the coalescence nitride layer 227 may be partially blocked. In addition, in the case of the coalescence nitride layer 227, relative tensile stress may be generated while growing islands coalesce with one another, and the first nitride semiconductor layer 221 may receive a high level of compressive stress from the buffer layer 210, while the coalescence nitride layer 227 on the mask layer 226 may receive a relatively low level of compressive stress or tensile stress. When a thickness of a layer having such a low level of compressive stress exceeds a critical point, cracks may occur in a thin film at the time of cooling, and the thickness of the coalescence nitride layer 227 may be selected under a condition that may prevent the occurrence of cracks and that may reduce a dislocation density.

Figure 11:
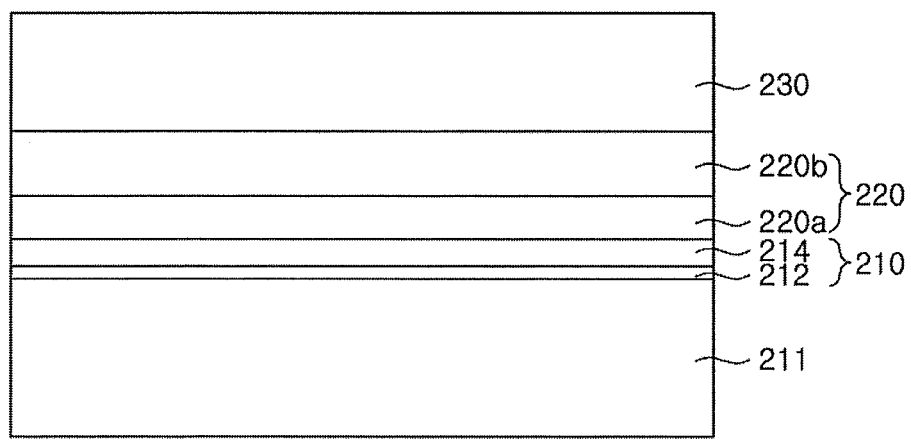

With reference to FIG. 11, a buffer layer 210, a stress compensation layer 220 and a nitride laminate 230 are sequentially disposed on a silicon substrate 201.

The stress compensation layer 220 used in the exemplary embodiment of the present disclosure may include first and second nitride semiconductor layers 220a and 220b formed under different growth conditions. The first nitride semiconductor layer 220a may be grown in a two dimensional mode, an increase rate of surface roughness may be controlled, and the occurrence of a twist grain boundary at an interface between the first nitride semiconductor layer 220a and the second nitride semiconductor layer 220b may be reduced.

The first nitride semiconductor layer 220a may be formed under first growth conditions, may have a surface roughness of 3 or less in a ratio with respect to surface roughness of the buffer layer 210, and the second nitride semiconductor layer 220b may be formed on the first nitride semiconductor layer 220a under second growth conditions. In the case of the second growth conditions, at least one of temperature, pressure, and a group V/III mol ratio may be different from those in the first growth conditions, and a three dimensional growth mode in the second growth conditions may increase as compared to that of the first growth conditions.

In the case of the temperature, a growth temperature of the first nitride semiconductor layer 220a may be set to be lower than that of the second nitride semiconductor layer. For example, the growth temperature of the first nitride semiconductor layer 220a may be in a temperature range higher than 900° C. but lower than 1040° C., for example, in a range of 930° C. to 1030° C. Under such growth temperature conditions, the first nitride semiconductor layer 220a may improve crystalline properties, and may decrease the occurrence of a twist grain boundary.

Subsequently, the second nitride semiconductor layer 220b may be grown under the second growth conditions different from the first growth conditions, and a three dimensional growth mode may be reinforced. For example, the temperature range of the second growth conditions may be set to be higher than a growth temperature of the second nitride semiconductor layer 220b. The second nitride semiconductor layer 220b may be grown at a temperature of 1040° C. or lower by controlling the volume fraction of hydrogen to be 40% or less, in nitrogen source gas, as described above. The first nitride semiconductor layer 220a may be grown at a temperature lower than 1040° C. by controlling the volume fraction of hydrogen to be in a condition similar to that of the second nitride semiconductor layer.

On the other hand, the first growth conditions of the first nitride semiconductor layer 220a may also be set by adjusting pressure or a mole ratio of group V/III sources. Substantially, as a level of the pressure is decreased, crystalline properties and compressive stress may be improved, and as a composition ratio of V/III increases, For example, the pressure range of the first growth conditions may be from 20 to 500 torr. The pressure range of the second growth conditions may be from 50 to 300 torr.

The first nitride semiconductor layer 220a may have a thickness from 2 to 1000 nm. As the thickness of the first nitride semiconductor layer 220a is increased, the occurrence of a twist grain boundary at an interface between the first and second nitride semiconductor layers 220a and 220b may be reduced. When the thickness of the first nitride semiconductor layer 220a is relatively great, crystalline properties in the entirety of the thin film may be deteriorated, for example, because the first nitride semiconductor layer 220a is grown at a relatively low temperature as compared to those of other nitride layers, and the occurrence of defects may increase. The reduction in the occurrence of twist grain boundary may be implemented together with reduction in a thickness of the first nitride semiconductor layer.

When the twist grain boundary is reduced, defects in the second nitride semiconductor layer 220b stacked on the first nitride semiconductor layer 220a may be reduced. For example, the first nitride semiconductor layer 220a may be in a thickness range from 2 to 1000 nm and may have roughness of 3 or less in a ratio with respect to roughness of the buffer layer, and defects in the second nitride semiconductor layer 220b stacked thereon may be decreased. Equivalent crystalline properties may be obtained at a relatively low thickness, and thinning the entire structural thinning in the thin film may be implemented. For example, even when a mask layer is not used, the entire thickness of the buffer layer 210 and the stress compensation layer 220 may be 6 μm or less, and a process time at a crystal growth stage and costs may be reduced.

The second nitride semiconductor layer 220b may be formed using $Al_xIn_yGa_{1-x-y}N$ (0≤x, y≤1, x+y<1). The second nitride semiconductor layer 220b may be continuously grown on the first nitride semiconductor layer 220a without an additional growth of a layer having a different composition thereon. The second nitride semiconductor layer 220b may have the same composition as that of the first nitride semiconductor layer 220a. For example, the first and second nitride semiconductor layers 220a and 220b may be GaN layers. The first nitride semiconductor layer 220a may be an undoped GaN layer, and the second nitride semiconductor layer 220b may be an n-type GaN layer.

In the foregoing embodiment, the restrictive supply scheme of hydrogen gas described above may also be used in all nitride crystal growth processes requiring high temperature growth. A nitride crystal having excellent crystallinity may be grown even at a relatively low growth temperature by lowering the fraction of hydrogen in the nitrogen source gas, transformation, for example, due to a difference in thermal expansion coefficients between the substrate and a nitride single crystal, may be suppressed, and a thin film thickness deviation, for example, due to the occurrence of bowing (or an increase in curvature), may be decreased.

A melt-back phenomenon, a problem in a silicon substrate at the time of growth of a nitride crystal, may be relaxed.

Figure 12:
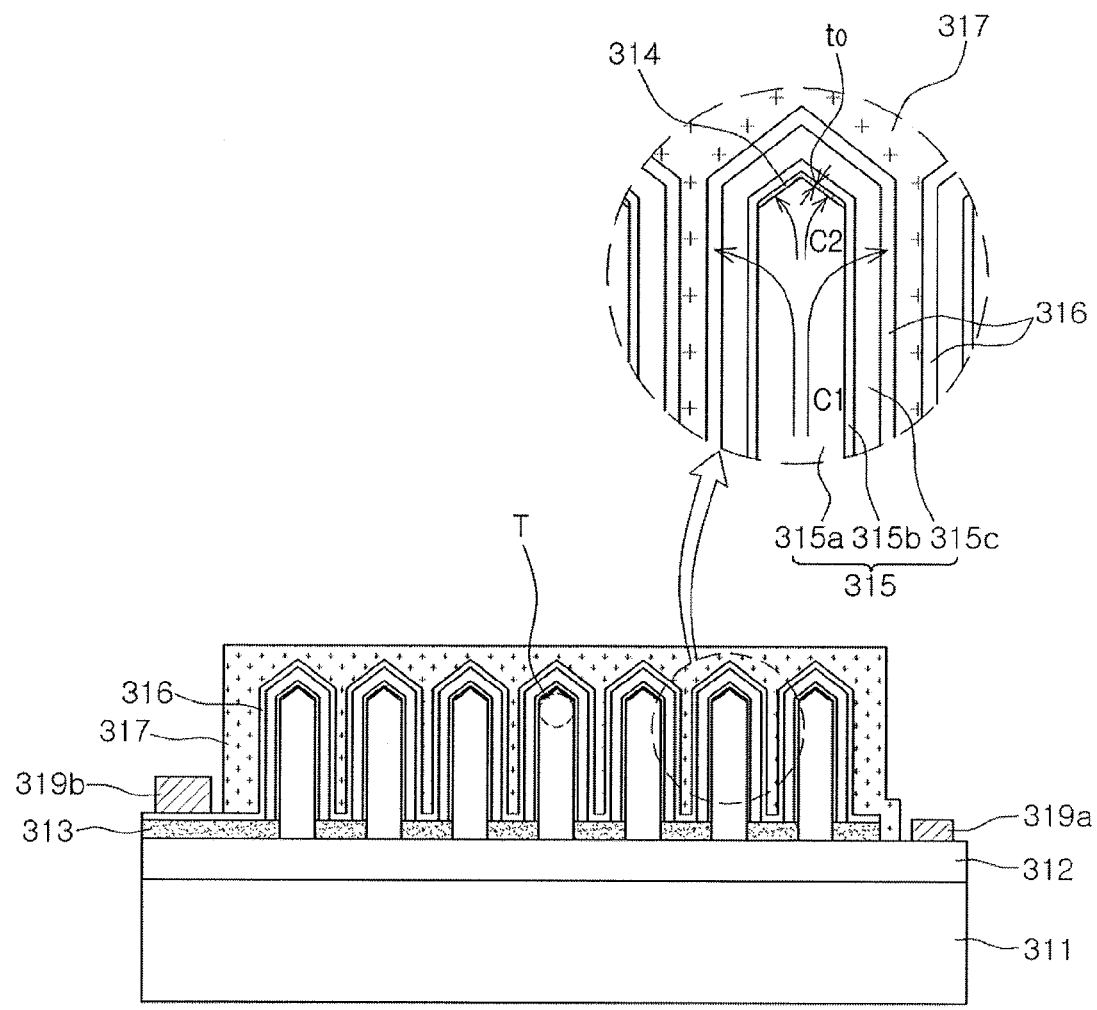
FIG. 12 illustrates a side cross-sectional view of a nanostructure semiconductor light emitting device as another example of a semiconductor device.

FIG. 12 is a side cross-sectional view of a nanostructure semiconductor light emitting device provided as another example of a semiconductor device.

A nanostructure semiconductor light emitting device 310 illustrated in FIG. 12 may include a base layer 312 formed using a first conductive semiconductor material, and a plurality of nanoscale light emitting structures 315 disposed thereon.

The base layer 312 may be formed on a substrate 311 to provide a growth surface of the nanoscale light emitting structure 315 and also may serve to provide an electrical connection for the plurality of nanoscale light emitting structures 315.

The substrate 311 may be an insulating, conductive or semiconductor substrate. For example, the substrate 311 may be a sapphire, SiC, Si, $MgAl_2O_4$, MgO, $LiAlO_2$, $LiGaO_2$, or GaN substrate. The base layer 312 may be a nitride semiconductor satisfying $Al_xIn_yGa_{1-x-y}N$ (0<x<1, 0≤y<1, 0≤x+y<1), and may be doped with n-type dopant such as Si, and may have a specific conductive type.

An insulating film 313 having openings H for the growth of the nanoscale light emitting structures 315, for example, nanocores, may be formed on the base layer 312. The base layer 312 may be exposed through the openings H, and in the exposed regions, nanocores 315a may be formed. The insulating film 313 may be used as a mask allowing for the growth of the nanocores 315a. The insulating film 313 may be formed using an insulating material such as $SiO_2$ or $SiN_x$ used in a semiconductor process.

The nanoscale light emitting structure 315 may include a nanocore 315a configured of a first conductive semiconductor, an active layer 315b and a second conductive semiconductor layer 315c sequentially formed on a surface of the nanocore 315a.

The nanocore 315a may be a nitride semiconductor satisfying an n-type $Al_xIn_yGa_{1-x-y}N$ (0≤x<1, 0≤y<1, 0≤x+y<1) similar to that of the base layer 312. For example, the nanocore 315a may be formed using n-type GaN. The active layer 315b may have a multiple quantum well (MQW) structure in which quantum well layers and quantum barrier layers are alternately stacked on top of each other, for example, a GaN/InGaN structure in the case of a nitride semiconductor. A single quantum well (SQW) structure may also be used. The second conductive semiconductor layer 315c may be a crystal satisfying p-type $Al_xIn_yGa_{1-x-y}N$ (0≤x<1, 0≤y<1, 0≤x+y<1).

The nanostructure semiconductor light emitting device 310 may include the second conductive semiconductor layer 315c and a contact electrode 316 in ohmic contact. The contact electrode 316 used in the present exemplary embodiment of the present disclosure may be formed using a transparent electrode material, and may emit light toward a nanoscale light emitting structure, for example, in a direction opposite to the substrate side. For example, in the case of the contact electrode 316, a transparent electrode material such as ITO may be used, and graphite may be used, for example. In an embodiment, the contact electrode 316 may contain, for example, Ag, Ni, Al, Rh, Pd, Ir, Ru, Mg, Zn, Pt, or Au, or may have a two-layer structure such as that of, for example, Ni/Ag, Zn/Ag, Ni/Al, Zn/Al, Pd/Ag, Pd/Al, Ir/Ag. Ir/Au, Pt/Ag, Pt/Al, or Ni/Ag/Pt. A flip-chip structure may be implemented using a reflective electrode structure.

An insulating protective layer 317 may be formed on upper surfaces of the nanoscale light emitting structures 315. This insulating protective layer 317 may be a passivation layer to protect the nanoscale light emitting structures 315. In an exemplary embodiment of the present disclosure, a space may be present between the plurality of nanoscale light emitting structures even after forming the contact electrode 316, and the insulating protective layer 317 may be formed to fill the space. As the insulating protective layer 317, an insulating material, such as $SiO_2$ or $SiN_x$, may be used. For example, in the case of the insulating protective layer 317, a material such as TetraEthylOrthoSilane (TEOS), BoroPhospho Silicate Glass (BPSG), CVD-$SiO_2$, Spin-on Glass (SOG), or Spin-on Dielectric (SOD) may be used.

In an embodiment, filling insulating protective layer 317 may fill the space. In another exemplary embodiment of the present disclosure, an electrode element used for the contact electrode 316 may fill a portion or the entirety of the space between the nanoscale light emitting structures 315.

The nanostructure semiconductor light emitting device 310 may include first and second electrodes 319a and 319b. The first electrode 319a may be disposed in a region in which a portion of the base layer 312 configured of the first conductive semiconductor is exposed. The second electrode 319b may be disposed in a region in which the contact electrode 316 is extended and exposed.

As illustrated in FIG. 12, the nanocore 315a may include an upper end portion T having a crystal plane different from a surface of a different region. The upper end portion T of the nanocore 315a may have an inclined crystal plane unlike a side of the nanocore 315. For example, the upper end portion T of the nanocore 315 may have a hexagonal pyramid shape.

An intermediate current blocking layer 314 may be formed on a surface of the upper end portion T of the nanocore 315a. The intermediate current blocking layer 314 may be disposed between the active layer 315b and the nanocore 315a.

The intermediate current blocking layer 314 may be formed using a material having a relatively high level of electrical resistance, and the occurrence of a leakage current that may occur in the upper end portion T of the nanocore 315a may be prevented. For example, the intermediate current blocking layer 314 may be a semiconductor layer that is intentionally undoped or is doped with a second conductive dopant opposite to those of the nanocore 315a. For example, when the nanocore 315a is configured of an n-type GaN, the intermediate current blocking layer 314 may be an undoped GaN layer or a GaN layer doped with a p-type dopant such as Mg. Such an intermediate current blocking layer 314 may not particularly discern from other layers provided in the vicinity thereof, and may be provided as a high resistance region implemented by a difference in a doping concentration or a doping material while being formed using the same material, for example, GaN. For example, an intermediate current blocking layer 314 may be formed by forming the nanocore 315a through the growth of GaN while supplying an n-type dopant source, and blocking the supply of the n-type dopant source or supplying a p-type dopant such as Mg while allowing continuous growth of GaN without pauses. An intermediate current blocking layer configured of, a different composition, $Al_xIn_yGa_{1-x-y}N$ ($0 \le x < 1$, $0 \le y < 1$, $0 \le x+y < 1$), may also be formed by further supplying an Al source and/or an In source in the course of growth of nanocore, GaN.

The intermediate current blocking layer 314 may have a thickness of about 50 nm or more, and a sufficient level of electrical resistance may be secured. The second conductive (e.g. p-type) dopant of the intermediate current blocking layer 314 may have a concentration of about $1.0 \times 10^{16}/cm^3$ or more. In the case of the intermediate current blocking layer 314 doped with the second conductive dopant, the thickness and concentration thereof may be implemented properly complementarily. For example, in the case of a relatively thin thickness, resistance may be secured by increasing a doping concentration, and in reverse cases, it may be applied equally.

The intermediate current blocking layer 314 according to the exemplary embodiment of the present disclosure may be disposed to be limited to the upper end portion T of the nanocore 315a. By such a selective location of the intermediate current blocking layer 314, an active layer region positioned on a surface of the upper end portion T of the nanocore 315a may not substantially contribute to the emission of light. For example, the flow of a current through an active layer region formed on a side of the nanocore 315a may be normally secured, and also, the flow of the current through an active layer region formed on the upper end portion T of the nanocore 315a may be blocked by the intermediate current blocking layer 314.

Only the active layer region formed on a single crystal plane (a side) may contribute to actual light emission, an active layer region positioned on a crystal plane (upper end portion) different therefrom may have a different composition, and an effect on light of light emission wavelengths, for example, an increase in a full width at half maximum, may be reduced, and a necessary level of light emission wavelengths may be designed.

Figure 13:
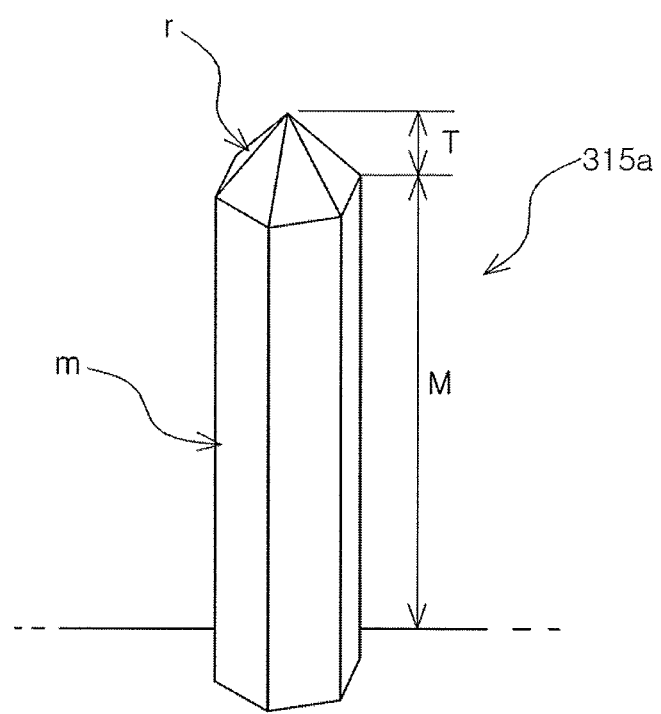
FIG. 13 illustrates a schematic perspective view of a nanocore used in a nanostructure semiconductor light emitting device illustrated in FIG. 12.

FIG. 13 is a schematic perspective view of a nanocore 315 illustrated in FIG. 12. With reference to FIG. 12, the nanocore 315 may be divided into a main part M providing a side having a first crystal plane, and an upper end portion T providing a surface having a second crystal plane different from the first crystal plane.

The nanocore 315a may have, for example, a crystal structure of a hexagonal system such as that of a nitride single crystal, the first crystal plane may be a non-polar plane (m-plane), and the second crystal plane may be a plurality of semipolar planes (r-planes). In an embodiment, the nanocore 315a may have a rod structure in which an upper end portion T thereof has a hexahedral pyramid shape.

The active layer may be grown on the surface of the nanocore 315a using a single process, a difference in compositions of the active layer, for example, the contents of indium at the time of growth of an InGaN layer, may occur, and a wavelength of light generated in a portion of the active layer grown on the upper end portion surface (r-plane) of the nanocore 315a may differ from a wavelength of light generated on the side (m-plane) of the nanocore 315a. A full width at half maximum of a light wavelength may increase, and there may be difficulties in implementing a precise design for light of necessary wavelengths. A semiconductor layer, for example, an active layer or a second conductive semiconductor layer, may be formed on the upper end portion of the semipolar plane to be relatively thin, and a leakage current may be concentrated thereon.

To help solve such a problem, as illustrated in FIG. 12, the intermediate current blocking layer 314 may be formed on an upper end portion of the nanocore 315a to reduce a leakage current, and light emission efficiency may be improved. The active layer portion positioned on the upper end portion of the nanocore 315a may be designed so as not to be used for the emission of light, whereby a precise design for a light emission wavelength may be carried out.

Such a nanostructure semiconductor light emitting device may be manufactured through various manufacturing methods. FIGS. 14A to 14E illustrate a growth process performed using a scheme of filling a nanocore by using a mask as a mold structure, by way of an example of a method of manufacturing a nanostructure semiconductor light emitting device.

Figure 14A:
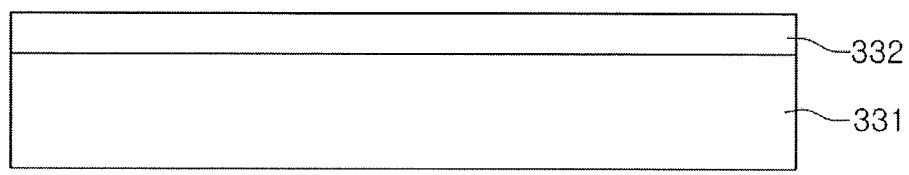
FIGS. 14A to 14E illustrate cross-sectional views of processes of an example of a method of manufacturing a nanostructure semiconductor light emitting device.

As illustrated in FIG. 14A, a first conductive semiconductor may be grown on a substrate 331, and a base layer 332 may be provided.

The base layer 332 may be provided as a structure electrically connecting as well as serving as a crystal growth surface allowing a nanoscale light emitting structure to be grown thereon, and the base layer 332 may be configured of a semiconductor single crystal having electrical conductivity. The base layer 332 may be directly grown, and the substrate 331 may be a crystal growth substrate. Before the growth of the base layer 332, a buffer layer configured of $Al_x$ $In_yGa_{1-x-y}N$ (0≤x≤1, 0≤y≤1, 0≤x+y≤1) may be formed on the substrate 331, and a multilayer film structure may be further formed. The multilayer film structure may include an undoped GaN layer and AlGaN layer or intermediate layers configured as a combination of these layers, to prevent a leakage current occurring from the base layer 332 toward the buffer layer and improve crystallinity of the base layer 332.

Figure 14B:
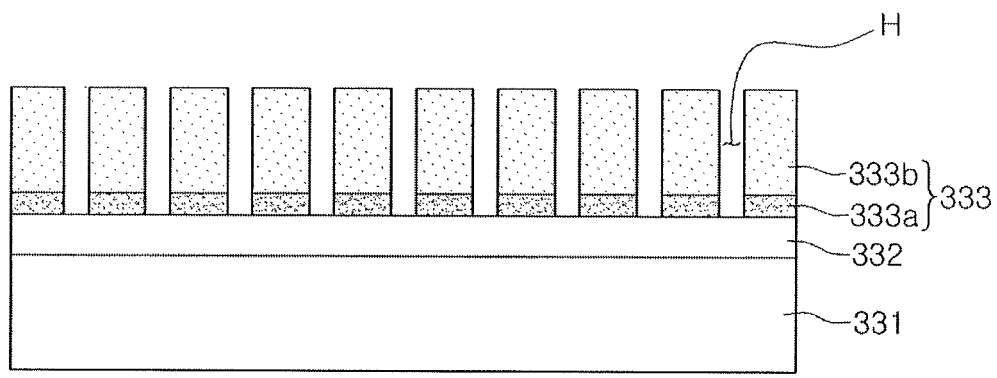

Subsequently, as illustrated in FIG. 14B, a mask 333 having a plurality of openings H and including an etch stop layer may be formed on the base layer 332.

The mask 333 used according to the exemplary embodiment of the present disclosure may include a first material layer 333a formed on the base layer 332 and a second material layer 333b formed on the first material layer 333a and having an etching rate higher than that of the first material layer 333a.

The first material layer 333a may be provided as the etch stop layer. For example, the first material layer 333a may have an etching rate lower than that of the second material layer 333b under etching conditions of the second material layer 333b. At least the first material layer 333a may be configured of a material having electrical insulation, and the second material layer 333b may also be configured of an insulating material.

The first and second material layers 333a and 333b may be formed using different materials to obtain a necessary difference in etching rates. For example, the first material layer 333a may be a SiN-based material layer and the second material layer 333b may be a $SiO_2$ layer. A difference in etching rates may be implemented using pore density. The second material layer 333b, or all of the first and second material layers 333a and 333b may be formed using a material having a porous structure to control a difference in porosity, and a difference in etching rates between the first and second material layers 333a and 333b may be secured. The first and second material layers 333a and 333b may be formed using the same material. For example, the first material layer 333a may be formed using $SiO_2$ having a first porosity, and the second material layer 333b may be formed using $SiO_2$, as the same material as that of the first material layer 333a, and may have a second porosity higher than the first porosity. Under the conditions that the second material layer 333b is etched, the first material layer 333a may have an etching rate lower than that of the second material layer 333b.

The total thickness of the first and second material layers 333a and 333b may be designed in consideration of a height of a necessary nanoscale light emitting structure. An etch stop level through the first material layer 333a may be designed in consideration of an overall height of the mask 333 from the surface of the base layer 332. After sequentially forming the first and second material layers 333a and 333b on the base layer 332, a plurality of openings H may be formed to expose regions of the base layer 3332 therethrough. The openings H may be formed by forming a photoresist on the mask layer 333 and through lithography and a wet/dry etching process using the same. The size of a respective opening H may be designed by considering the size of a necessary nanoscale light emitting structure. For example, the opening H through which the surface of the base layer 332 is exposed may have a width (or a diameter) of 600 nm or less, for example, in a range of 50 to 500 nm or less.

The opening H may be formed using a semiconductor process. For example, the opening H having a relatively high aspect ratio by using a deep etching process may be formed.

An aspect ratio of the opening H may be implemented to be 5:1 (height:width) or higher, for example, 10:1 or higher.

Although it may be changed depending on etching conditions, the opening H in the first and second material layers 333a and 333b may have a width reduced toward the base layer 332.

In the deep etching process, a dry etching process may be used, and reactive ions generated from plasma may be used or ion beams generated in a relatively high level of vacuum may be used. Such dry etching may realize a precise process with respect to microstructure without geometrical limitations as compared with wet etching. A CF-based gas may be used in etching an oxide film of the mask 333. For example, an etchant obtained by combining at least one of $O_2$ and Ar to a gas such as $CF_4$, $C_2F_6$, $C_3F_8$, $C_4F_8$, or $CHF_3$ may be used.

Figure 15A:
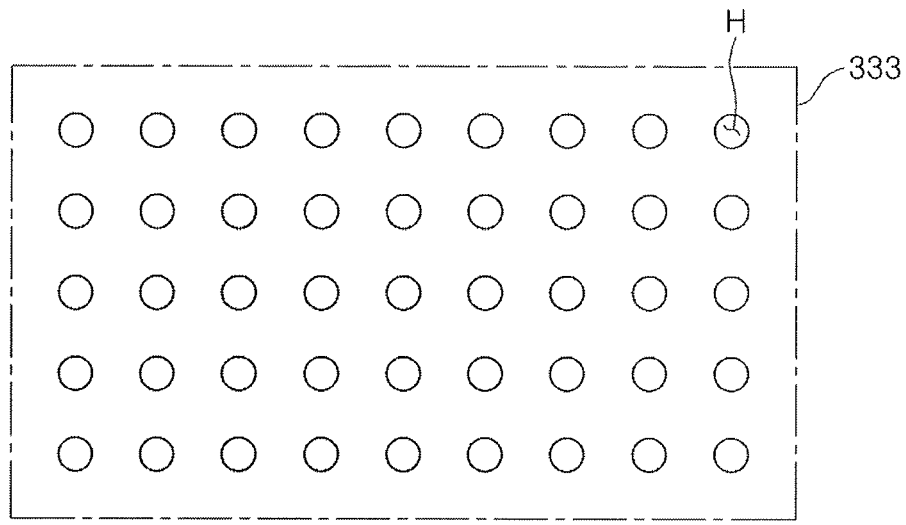
FIGS. 15A and 15B illustrate plan views of masks providing various examples of opening shapes.
Figure 15B:
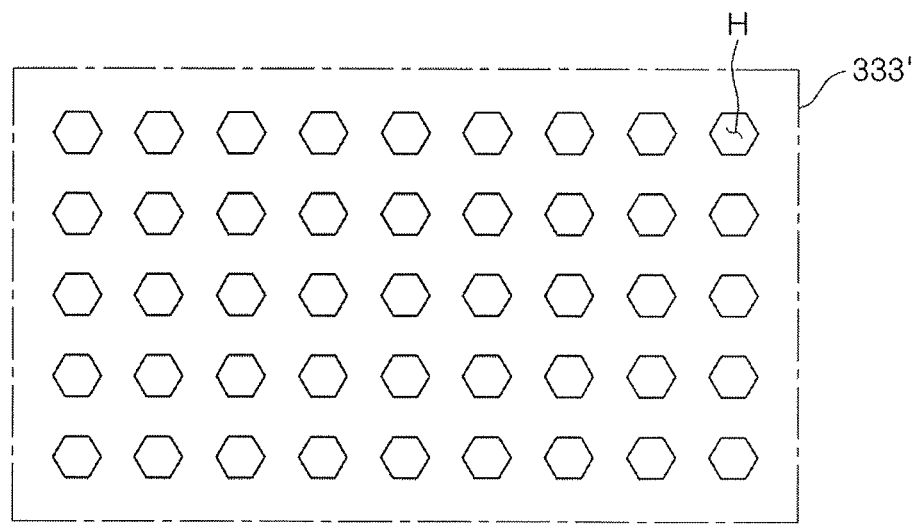

A planar shape of the opening H and the alignment thereof may be variously implemented. For example, in the case of a planar shape, the opening H may have various shapes such as a polygonal shape, a quadrangular shape, an elliptical shape or a circular shape. The mask 333 illustrated in FIG. 14B may have the openings H having, for example, a circular plan shape aligned therein, as illustrated in FIG. 15A. As illustrated in a mask 333' of FIG. 15B, openings having a regular hexagonal plan shape may be aligned.

Figure 16A:
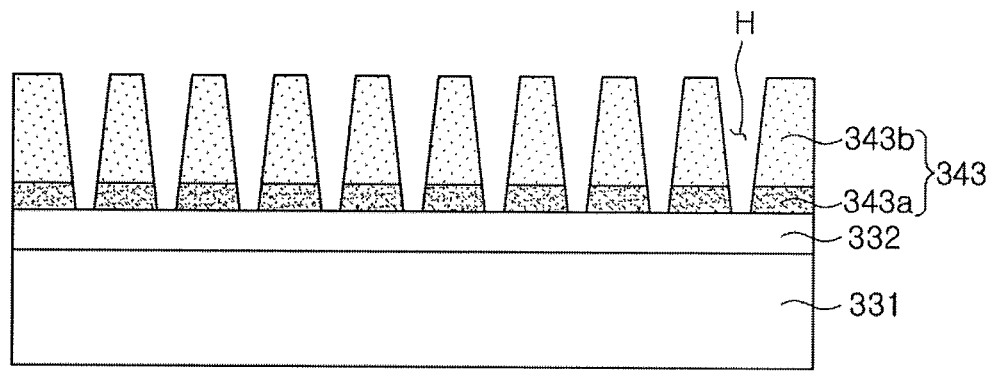
FIGS. 16A and 16B illustrate side cross-sectional views of masks providing various examples of an opening shape.
Figure 16B:
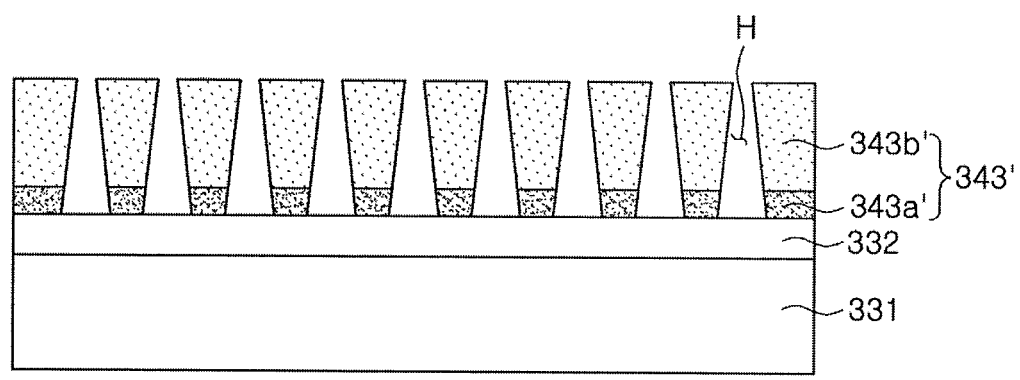

In an embodiment, the opening H, as shown in FIG. 14B, may have, for example, the form of a regularly formed rod. The opening H may be variously shaped, for example, due to using an appropriate etching process. As such examples, FIGS. 16A and 16B illustrate different shaped openings formed in the mask. In FIG. 16A, a mask 343 configured of first and second material layers 343a and 343b has an opening H having a pillar form of which cross sections are gradually increased in area in a direction toward an upper part thereof. In FIG. 16B, a mask 343' configured of first and second material layers 343a' and 343b' may have openings H having a pillar form of which cross sections have gradually reduced areas in a direction toward an upper part thereof.

Figure 14C:
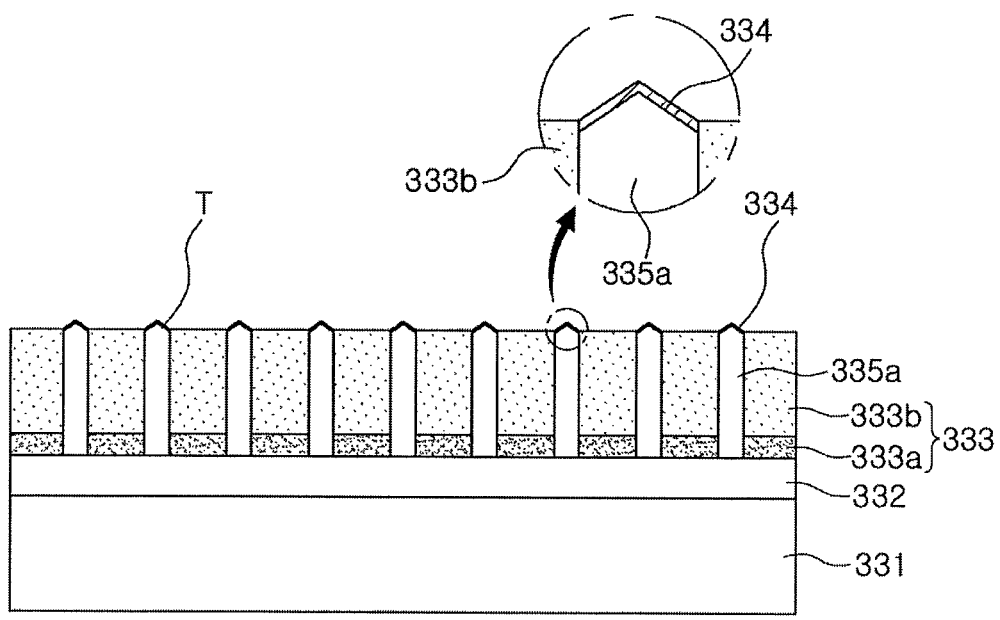

Subsequently, as shown in FIG. 14C, a first conductive semiconductor is grown on the exposed regions of the base layer 332 to fill the plurality of openings H, and a plurality of nanocores 335a and subsequently the intermediate current blocking layer 334 on the upper end portion T of the nanocore 335a are formed.

The first conductive semiconductor of the nanocore 335a may be an n-type nitride semiconductor and may be formed using the same material as that of the first conductive semiconductor of the base layer 332. For example, the base layer 332 and the nanocore 335a may be formed using n-type GaN.

A nitride single crystal configuring the nanocore 335a may be formed using metal organic chemical vapor deposition (MOCVD) or molecular beam epitaxy (MBE). The mask 333 may serve as a mold for a grown nitride single crystal to provide the nanocore 335a having a form corresponding to that of the opening H. For example, the nitride single crystal may be selectively grown on regions of the base layer 332 exposed to the opening H by using the mask 333 to fill the opening H. The filled nitride single crystal may have a form corresponding to that of the opening H.

In a state in which the mask 333 remains as it is, the intermediate current blocking layer 334 may be formed on the surface of the upper end portion T of the nanocore 335a, and the intermediate current blocking layer 334 may be formed on a upper end portion without a process of forming a separate mask.

The intermediate current blocking layer 334 may be a semiconductor layer that is intentionally undoped or is doped with the second conductive dopant opposite to those of the nanocore 335a. For example, when the nanocore 335a is formed using n-type GaN, the intermediate current blocking layer 334 may be an undoped GaN layer or may be a GaN layer doped with the p-type dopant such as Mg. Through only switching a kind of dopant in a single process, the nanocore 335a and the intermediate current blocking layer 334 may be continuously formed. The entire process may be further simplified by combining a formation process of the intermediate current blocking layer 334 and a mold process.

Figure 14D:
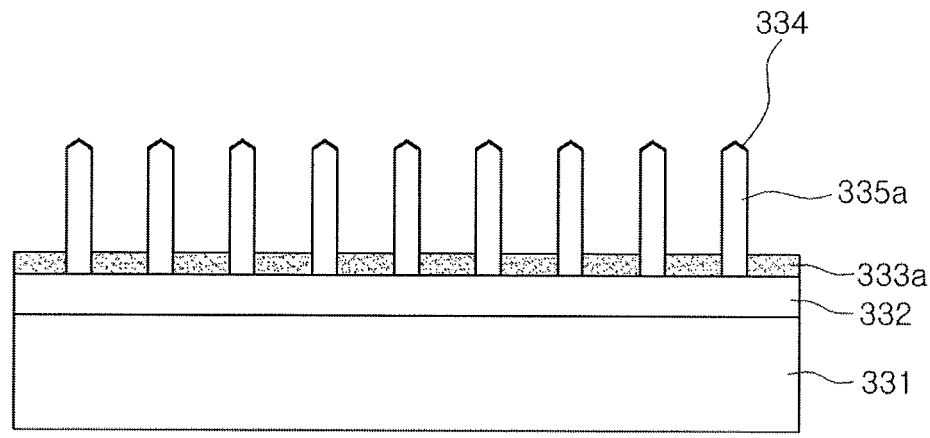

Subsequently, as illustrated in FIG. 14D, the mask 333 may be removed to the layer of the etch stop layer, the first material layer 333a, and sides of the plurality of nanocores 335a may be partially exposed.

In the exemplary embodiment of the present disclosure, by applying an etching process by which the second material layer 333b may be selectively removed, only the second material layer 333b may be removed and the first material layer 333a may remain. The remaining first material layer 333a may prevent an active layer 335b and a second conductive semiconductor layer 335c from be connected to the base layer 332 in a subsequent process.

As in the exemplary embodiment of the present disclosure, in the process of manufacturing a nanoscale light emitting structure by using a mask having an opening as a mold, an additional heat treatment process may be introduced to improve crystalline properties.

First, during the growth of the nanocores 335a before forming the intermediate current blocking layer 334, a stabilization process (a heat treatment process) of the nanocores 335a may be further performed, and crystallinity of the nanocores 335a may be improved. For example, when a necessary nanocore 335a is grown to a middle point in a growth section thereof (at a height of about 0.2 to 1.8 μm on the base layer), the supply of a TMGa source, a group III element supply source of GaN, is stopped, and a heat treatment at a temperature (about 1000 to 1200° C.) similar to that of the substrate during the growth for about 5 seconds to about 5 minutes under a $NH_3$ atmosphere.

After the growth of the nanocores 335a is completed and an upper layer (333b) of the mask is removed, surfaces of the nanocores 335a may be heat treated under predetermined conditions, crystal planes of the nanocores 335a may switch to stabilized surfaces, and may be advantageous for a crystal growth as in semipolar or non-polar crystal planes. Such a process may be described with reference to FIGS. 17A and 17B.

Figure 17A:
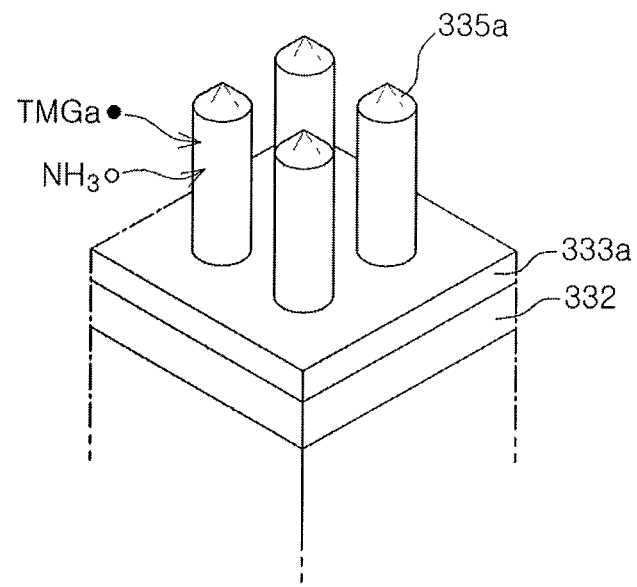
FIGS. 17A and 17B illustrate schematic views of thermal processing applied to the process of FIG. 14D.
Figure 17B:
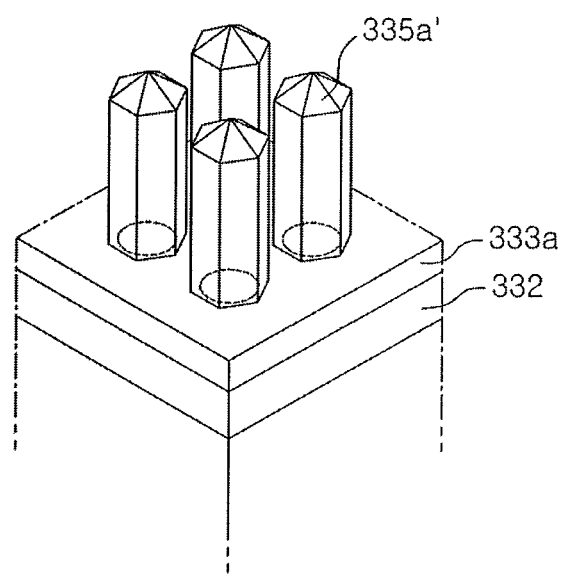

FIGS. 17A and 17B illustrate drawings of a heat treatment process applied to the process of FIG. 14D.

FIG. 17A illustrates nanocores 335a that can be considered to be nanocores obtained in the process of FIG. 14D. The nanocore 335a may have a crystal plane determined by a shape of an opening. Although the nanocore has a different crystal plane depending on a shape of the opening, such an obtained nanocore surface may have a relatively unstable crystal plane, which may be a factor deteriorating subsequent crystal growth conditions.

As in the exemplary embodiment of the present disclosure, the opening may have a cylindrical rod form, a side of the nanocore 335a may have a curved surface other than a specific crystal plane, as illustrated in FIG. 17A.

When this nanocore is subjected to a heat treatment, unstable crystals on the surfaces thereof may be re-aligned to then have a stabilized crystal plane in a semi-polarity or a non-polarity state, as illustrated in FIG. 17B. The heat treatment may be performed under a temperature of 600° C. or higher, for example, 800 to 1200° C., for several seconds to tens of minutes (one second to sixty minutes), and conversion to a stabilized crystal plane may be realized.

In the case of such a heat treatment process, when a substrate temperature is lower than 600° C., since difficulties in terms of crystal growth of nanocores and realignment thereof may be present, heat treatment effects may not be expected. When a substrate temperature is higher than 1200° C., since nitrogen (N) may evaporate, crystallinity may be deteriorated. A heat treatment for a time shorter than one second may not be expected to realize a sufficient heat treatment effect, and a heat treatment for tens of minutes, for example, a time longer than 60 minutes, may degrade efficiency in a manufacturing process.

For example, in the case of growth on plane C (0001) of the sapphire substrate (in the case of a silicon substrate, growth on plane (111)), the nanocores 335a having a cylindrical shape as illustrated in FIG. 17A may be subjected to a heat treatment at a proper temperature as above, and unstable crystal planes, curved surfaces, (sides) may be converted into hexagonal crystal pillars (335a of FIG. 17B) having non-polar surfaces (m-planes). Such a process of stabilizing a crystal plane may be implemented through a high-temperature heat treatment process.

In a case in which crystals positioned on the surface at a relatively high temperature are re-aligned or a source gas remains in a chamber, it may be understood that partial re-growth is performed through deposition of the remaining source gas to have a stabilized crystal plane.

In the case of re-growth, a heat treatment process may be performed in an atmosphere in which source gas remains in a chamber, or a heat treatment may be performed in a condition of intentionally supplying a relatively small amount of source gas. For example, as illustrated in FIG. 6A, in the case of an MOCVD chamber, TMGa and $NH_3$ remain, and in this residual atmosphere, the heat treatment is performed, source gas reacts with the nanocore surface, partial re-growth may be realized, and a stabilized crystal plane may be provided. During the re-growth, the size of the heat-treated nanocore 335a' may be slightly increased as compared to that of the nanocore 335a before the heat treatment, with reference to FIGS. 17A and 17B.

As such, such an additional heat treatment process may contribute to improvements in crystalline properties of nanocores. For example, through such a heat treatment process, non-uniformity (for example, a defect) on a surface of a nanocore after removing a mask may be eliminated, and in addition, realignment of internal crystals may improve crystal stabilization. This heat treatment process may be performed within the chamber under conditions similar to those of a nanocore growth process after removing the mask. For example, although the heat treatment temperature, i.e., a substrate temperature, may be in a range of 800 to 1200° C., a similar effect thereto may also be expected in the heat treatment process at 600° C. or higher.

Figure 14E:
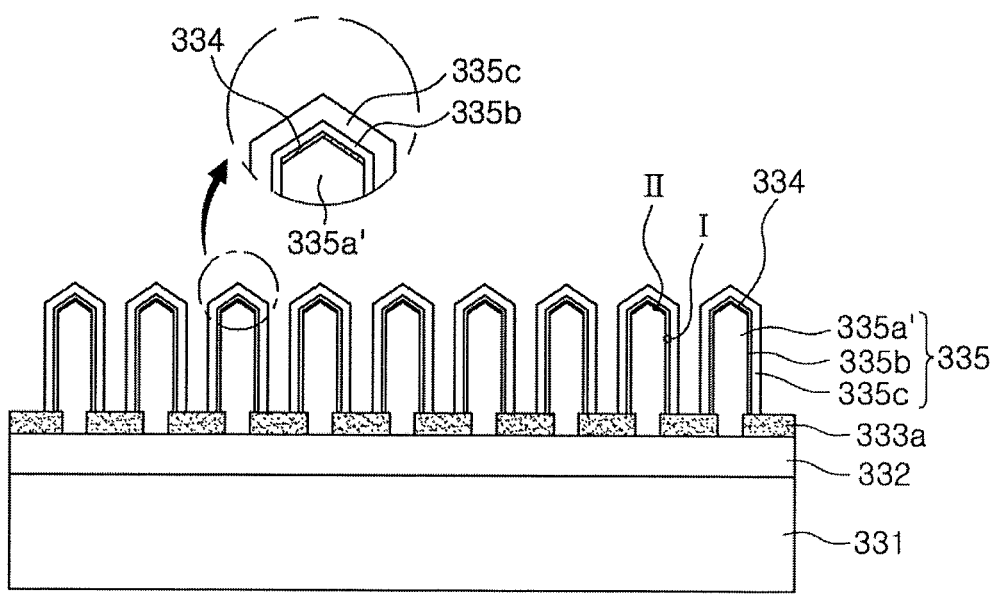

Subsequently, as illustrated in FIG. 14E, an active layer 335b and a second conductive semiconductor layer 335c may be sequentially grown on surfaces of the plurality of nanocores 335a'.

Through such a process, a nanoscale light emitting structure 335 may have a core-shell structure in which a first conductive semiconductor is provided as a nanocore 335a', and an active layer 335b surrounding the nanocore 335a' and a second conducive semiconductor layer 335c are provided as a shell layer.

The nanocore 335a' may have an upper end portion having a crystal plane different from that of a side thereof. An active layer formed on the upper end portion of the nanocore and portion II of the second conductive semiconductor layer may have a composition and/or a thickness different from those of an active layer formed on a side thereof and portion I of the second conductive semiconductor layer. The intermediate current blocking layer 334 may be disposed on the upper end portion of the nanocore 335a', and a problem of a leakage current and a problem of a light emitting wavelength occurring thereby may be solved. By such a selective disposition of the intermediate current blocking layer 334, a flow of current through an active layer region formed on a side of the nanocore 335a' may be secured normally, and the flow of current through an active layer region formed on the upper end portion of the nanocore 335a' may also be blocked by the intermediate current blocking layer 334.

Whereby, a leakage current may be prevented from being concentrated on the upper end portion of the nanocore 335a', to precisely design a necessary light emitting wavelength while improving efficiency.

Such characteristics may be extendedly applied to a method of maintaining a chemical vapor deposition apparatus according to other exemplary embodiments of the present disclosure.

Figure 18:
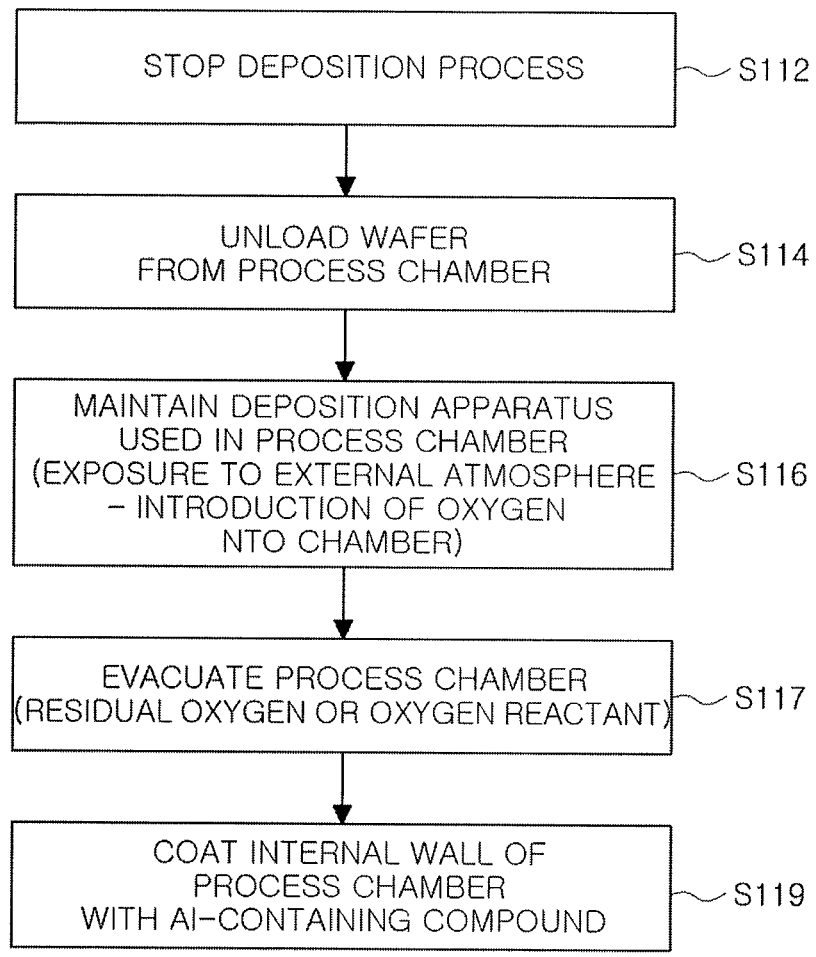
FIG. 18 illustrates a flow chart of a method of maintaining a chemical vapor deposition apparatus according to an exemplary embodiment of the present disclosure.

FIG. 18 illustrates a flow chart of a method of maintaining a chemical vapor deposition apparatus according to an exemplary embodiment of the present disclosure.

With reference to FIG. 18, a deposition process is stopped in S112, and in a state in which a wafer is unloaded from a process chamber in S114, a deposition apparatus used in the process chamber may be maintained in S116.

In an actual mass-production process, planned maintenance (PM) of production equipment, as well as periodic cleaning, may be required. For example, when a deposition process may be repetitively performed in a process chamber, thin film deposition at a relatively high temperature may affect a region in which the deposition is not required, as well as a wafer surface necessary for deposition. Severe parasitic deposition may occur on a member within the chamber such as, for example, a shower head spraying structure in a process chamber.

Therefore, a periodical/occasional cleaning process may be required, and first and second cover members configuring a shower head or a susceptor may be replaced or disassembled, and after servicing such as, for example, cleaning, they may be re-mounted.

In such a process, an impurity element, which may act disadvantageously at the time of actual deposition, may be introduced into the chamber.

After the maintenance, the process chamber may be evacuated in S117.

This exhausting process may be performed using an exhaust pump ('80' of FIG. 2) or a vacuum pump ('90' of FIG. 2). This process may be performed to remove a material such as, for example, a cleansing agent, introduced into the chamber during a preceding maintenance process. However, even when the exhausting process is used, a material introduced into the process chamber may remain. For example, an interior of the process chamber may be exposed to an external atmosphere in the preceding maintenance process. The introduced oxygen may react with an internal surface of the process chamber, and may remain on the surface thereof in the form of an oxide film. Oxygen depending on such an oxide film may be combined with other sources at a relatively high temperature in a deposition process to affect deposited thin film characteristics. This may be problematic in the case that the interior of the process chamber is formed using an oxidizable material, for example, SUS.

Subsequently, at least an aluminum source and a nitrogen source may be supplied to an interior of the process chamber in S119.

In this process, an aluminum-containing nitride film such as an AlN film or an aluminum compound containing oxygen may be formed by supplying at least an aluminum source and a nitrogen source. The aluminum compound containing oxygen may be an oxygen-containing aluminum nitride film. For example, in the present process, an aluminum element or aluminum-containing nitride film may be combined with oxygen or an oxygen reactant. For example, when the interior of a process chamber is exposed to an external atmosphere and an oxide film is formed on an internal surface of the process chamber or oxygen remains therein, the oxide film or oxygen may be passivated by an aluminum compound film. By combining oxygen (O) present within the process chamber with an Al component, an influence of oxygen, which may act advantageously in a subsequent deposition process, may be reduced or blocked.

The influence of impurities such as oxygen present within a process chamber may be gradually reduced as the number of deposition runs performed repetitively is increased, and stabilization may be realized. As a result, even when a thin film is formed under a single deposition condition, thin film characteristics formed at the time of initial run and thin film characteristics formed after stabilization may be different. For example, in a process for a nitride semiconductor device, when oxygen disturbing activation of a p-type dopant remains, doping efficiency of a p-type dopant may be deteriorated or doping thereof is delayed in the case of a nitride semiconductor device obtained through initial run, despite that a p-type dopant source is supplied under the same condition. Further, as residual oxygen increases, stabilization may be delayed and a doping effect may decrease.

The following Example and Comparative Example are provided in order to highlight characteristics of one or more embodiments, but it will be understood that the Example and Comparative Example are not to be construed as limiting the scope of the embodiments, nor is the Comparative Example to be construed as being outside the scope of the embodiments. Further, it will be understood that the embodiments are not limited to the particular details described in the Example and Comparative Example.

Comparative Example

A nitride semiconductor light emitting device (see FIG. 5) was manufactured using a MOCVD apparatus (see FIG. 2). As a susceptor employed in the MOCVD apparatus, a susceptor on which fourteen pocket portions are divided and arrayed in an external region and an internal region was used as illustrated in FIG. 4.

A process of manufacturing a nitride semiconductor light emitting device was performed repeatedly dozens of times. A p-type nitride semiconductor layer had a dual-layer structure including a p-type AlGaN electron stopping layer/p-type GaN/p+-type GaN contact layer, and this p-type nitride semiconductor layer was deposited through a single-crystal growth process, and as a p-type dopant source, $Cp_2Mg$ was used. A planned maintenance (PM) process was performed after 65 runs. During this procedure, the interior of the process chamber was exposed to an external atmosphere, and an additional exhausting process and cleaning process were carried out. After the maintenance, a plurality of runs under conditions for manufacturing the same type of nitride semiconductor light emitting device were executed.

Example

Similar to the Comparative Example, a nitride semiconductor light emitting device (see FIG. 5) was manufactured using a MOCVD apparatus (see FIG. 2). However, after the same exhausting process and cleaning process as those of the Comparative Example after the planned maintenance (PM) process, a susceptor was heated at about 1100° C. before disposing a wafer, and then, a mixture gas of $NH_3$+$N_2$+$H_2$ was supplied together with TMAl to thereby form an AlN film on an internal surface of a process chamber. Then, a plurality of runs, under conditions for manufacturing the same type of nitride semiconductor light emitting device, were executed.

First, operating voltage and light output with respect to the nitride semiconductor light emitting devices obtained through the Comparative Example and the Example were measured for each run.

Figure 19A:
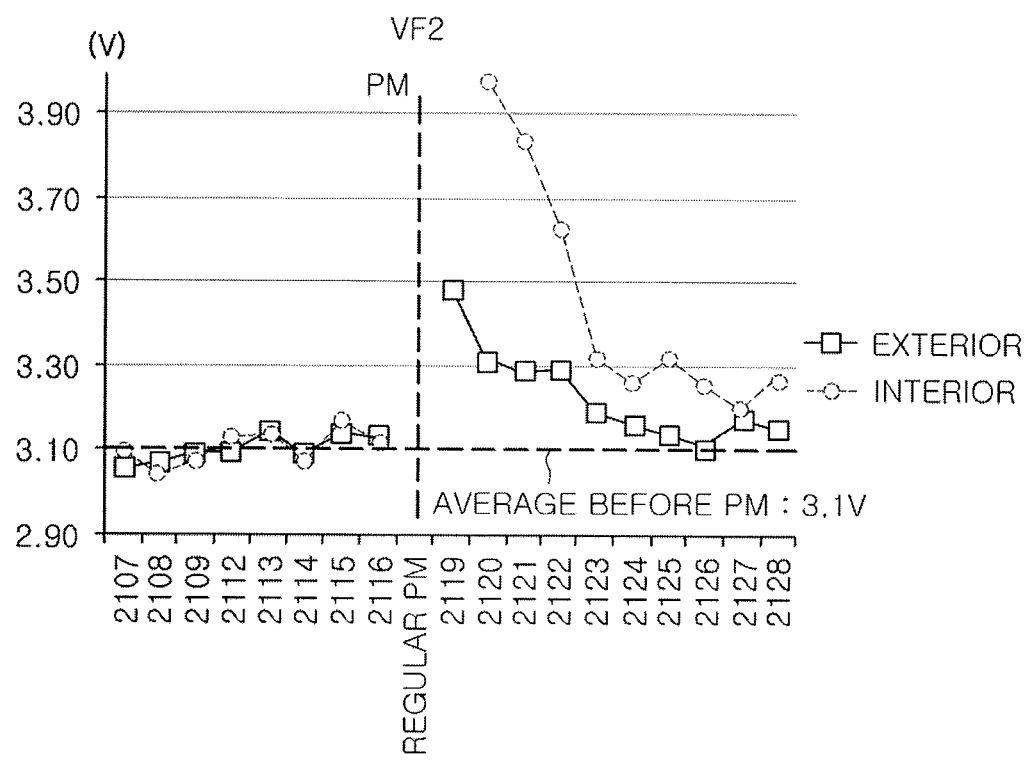
FIGS. 19A and 19B illustrate graphs of a comparison of operating voltages and output of light of a nitride semiconductor light emitting device manufactured before and after equipment maintenance, based on a comparative example.
Figure 19B:
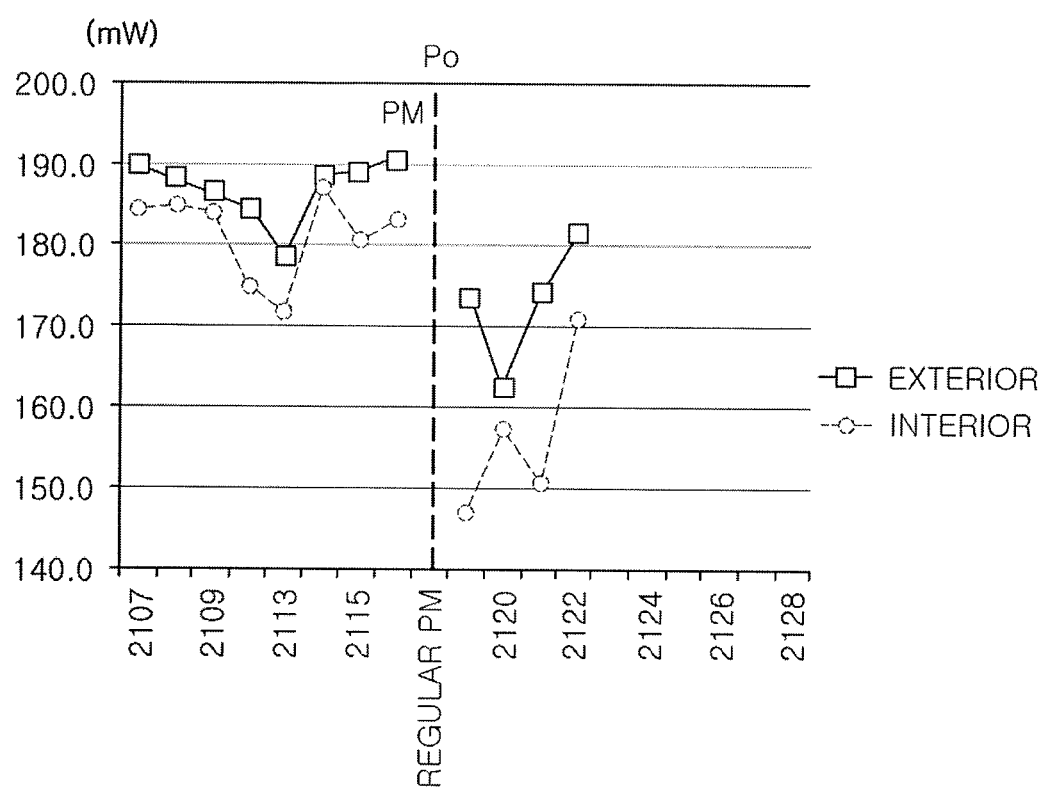

FIGS. 19A and 19B illustrate graphs of a comparison of operating voltages and output of light from a nitride semiconductor light emitting device manufactured before and after equipment maintenance based on the Comparative Example.

With reference to FIG. 19A, the operating voltage of the nitride semiconductor light emitting device manufactured before PM was measured without a significant deviation from about 3.1 V. An approximately uniform level of operating voltage was also represented in the internal region and external region of the susceptor. However, an operating voltage of the nitride semiconductor light emitting device manufactured after PM tended to be much higher than 3.1 V, i.e., an average operation voltage before PM. In an initial run, as compared with the average operating voltage before PM, operating voltages increased by 0.4 V in the external region and 0.9 V or more in the internal region. Further, as the number of runs increased, deviation was further reduced, but the deviation still remained even after runs of ten times or more.

In the case of the Comparative Example, deterioration in performance of the nitride semiconductor light emitting device manufactured after PM was also apparent with respect to light output. While light was output at a level of 180 mW or more before the PM process, light output was reduced to 160 mW or lower in the nitride semiconductor light emitting device manufactured after PM.

Figure 20A:
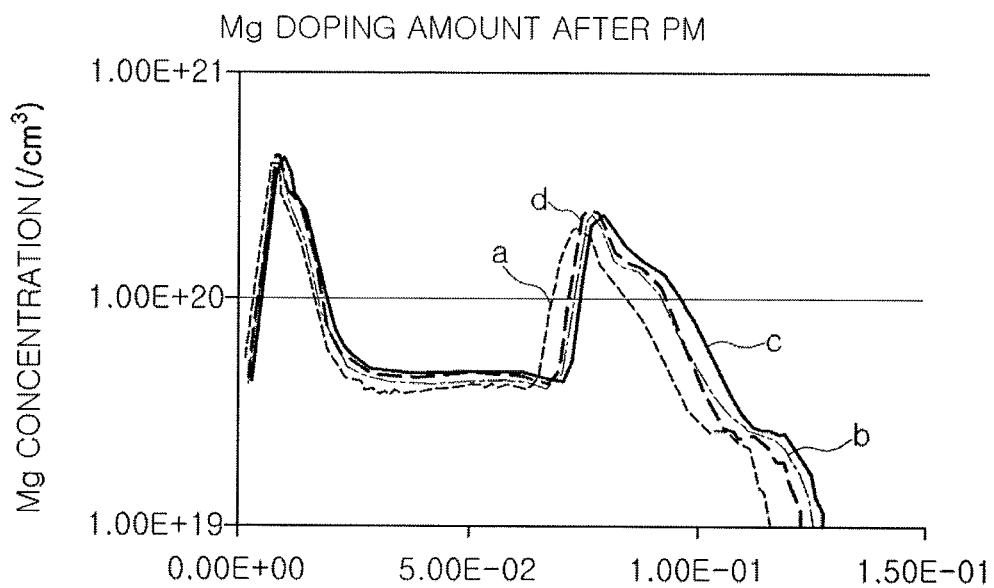
FIGS. 20A and 20B illustrate graphs of the distribution of doping amount in a p-type nitride semiconductor of a nitride semiconductor light emitting device manufactured after equipment maintenance, based on a comparative example.
Figure 20B:
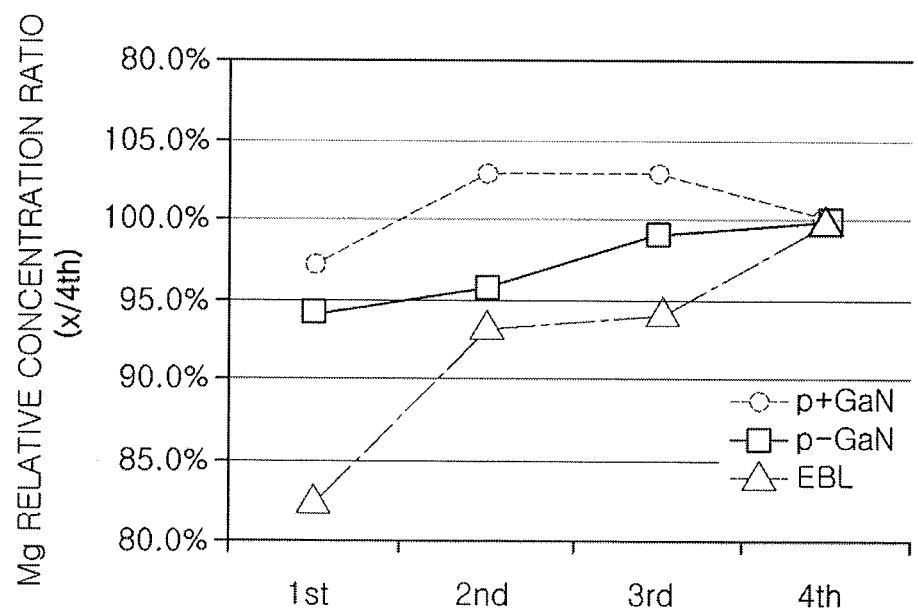

To determine a reason for a decrease in light output and an increase in an operating voltage after PM, shown in the Comparative Example, doping concentration of a p-type nitride semiconductor layer with respect to the nitride semiconductor light emitting device manufactured after PM (in one-run (a), two-runs (b), three-runs (c) and four-runs (d)) was represented. FIGS. 20A and 20B illustrate graphs of the distribution of Mg concentration in a p-type nitride semiconductor of a nitride semiconductor light emitting device manufactured after PM in the Comparative Example.

With reference to FIG. 20A, when a level of distribution is substantially lowered in a single run, different levels of distribution profile are also exhibited after two to four runs. An extent of inconsistency of the distribution in a relatively deep position (an electron stopping layer region) was shown.

In FIG. 20B, as compared with a doping concentration of each layer of a p-type nitride semiconductor layer of the nitride semiconductor light emitting device after four runs, a doping concentration (at a single position) of the nitride semiconductor light emitting device manufactured in a different run was represented as a percentage. A significantly low level of concentration was shown at the time of single run. As the number of runs is repeated, the deviation was slightly reduced, but, after three runs, a deviation was still present. In addition, as described above, it was confirmed that such deviation in a level of Mg concentration was further increased in the electron stopping layer.

Problems in terms of such a p-type doping concentration may occur, for example, because the interior of the chamber is exposed to an external atmosphere after PM, and oxygen remaining in the chamber interior or an internal surface of the chamber may be oxidized. For example, the residual oxygen within the chamber may be combined with Mg, a p-type dopant, in a high-temperature deposition process, and doping may be disturbed or delayed.

As a result, in the initial run after PM, a p-type doping concentration in the entirety terms may be lower than a desired level. In respective run after PM, the p-type electron stopping layer exhibits a relatively low level of doping concentration, while a p+-type contact layer exhibits a slightly high level of concentration, which may be problematic.

Characteristics of the nitride semiconductor light emitting device after PM may not be secured, for example, due to disturbance in doping of a p-type dopant or delay thereof.

Figure 21A:
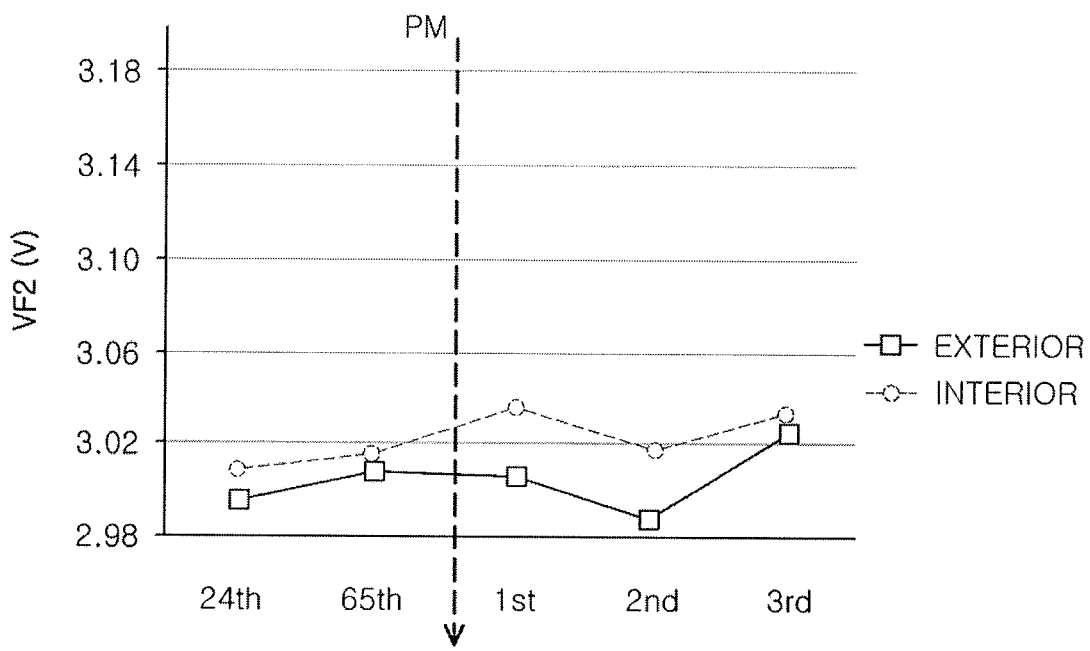
FIGS. 21A and 21B illustrate graphs of a comparison of operating voltages and output of light of a nitride semiconductor light emitting device manufactured before and after equipment maintenance, based on an example.
Figure 21B:
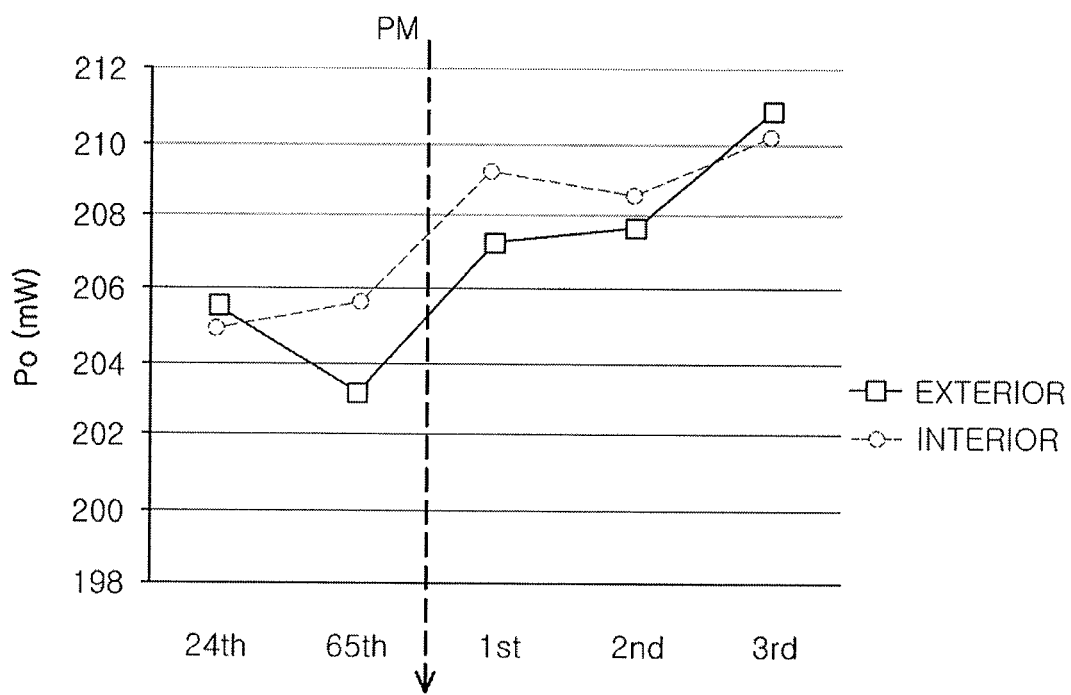

On the other hand, as in the Example, when after PM, an internal surface of the chamber is coated with an AlN film, operating voltage characteristics (see FIG. 21A) may be managed comparatively stably within a range of the average driving voltage (3.01V) and deviation of ±0.2V before PM, and in terms of light output (see FIG. 21B), it can be appreciated that light output characteristics were further improved by about 1 to 5%. Such effects may be provided by equipment performance improvement effects through PM as well as solving the problem in terms of residual oxygen after PM.

Figure 22:
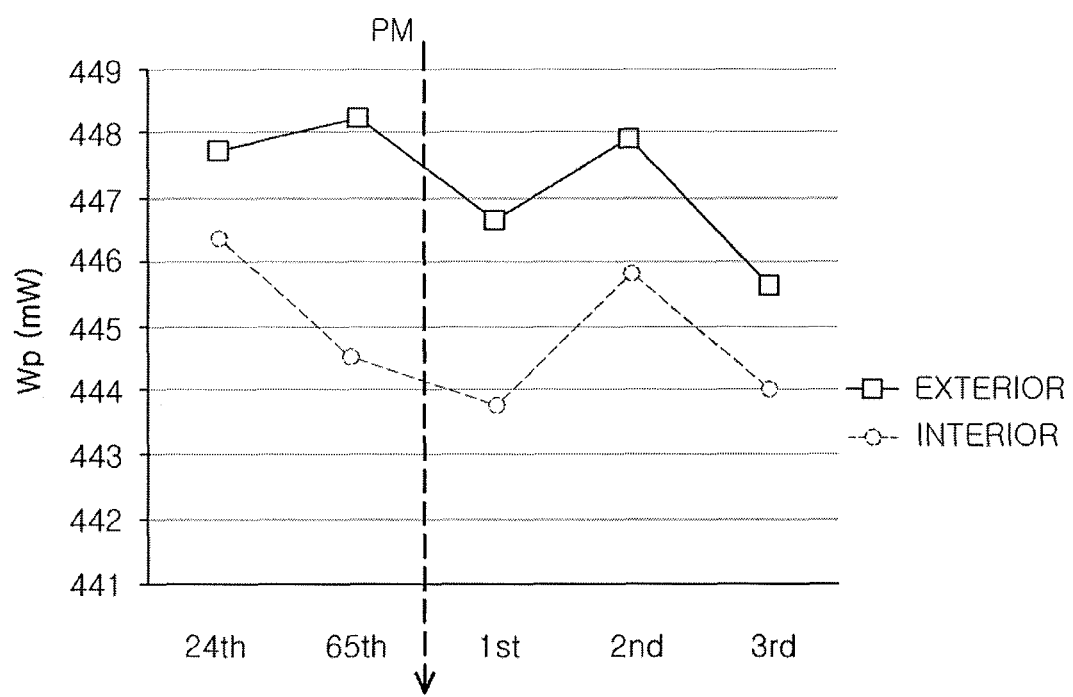
FIG. 22 illustrates a graph of a comparison of emission wavelengths of a nitride semiconductor light emitting device manufactured before and after equipment maintenance, based on an example.

As illustrated in FIG. 22, a nitride semiconductor light emitting device manufactured in the Example may be stably managed in an allowance distribution range of an emission light wavelength even before and after PM.

Although the preceding example describes the example in which before an initial deposition process after PM, an aluminum compound film is introduced, the aluminum compound film may be introduced during plural runs regardless of execution of PM, and a similar effect may be expected. Such an example is illustrated in FIG. 22.

Figure 23:
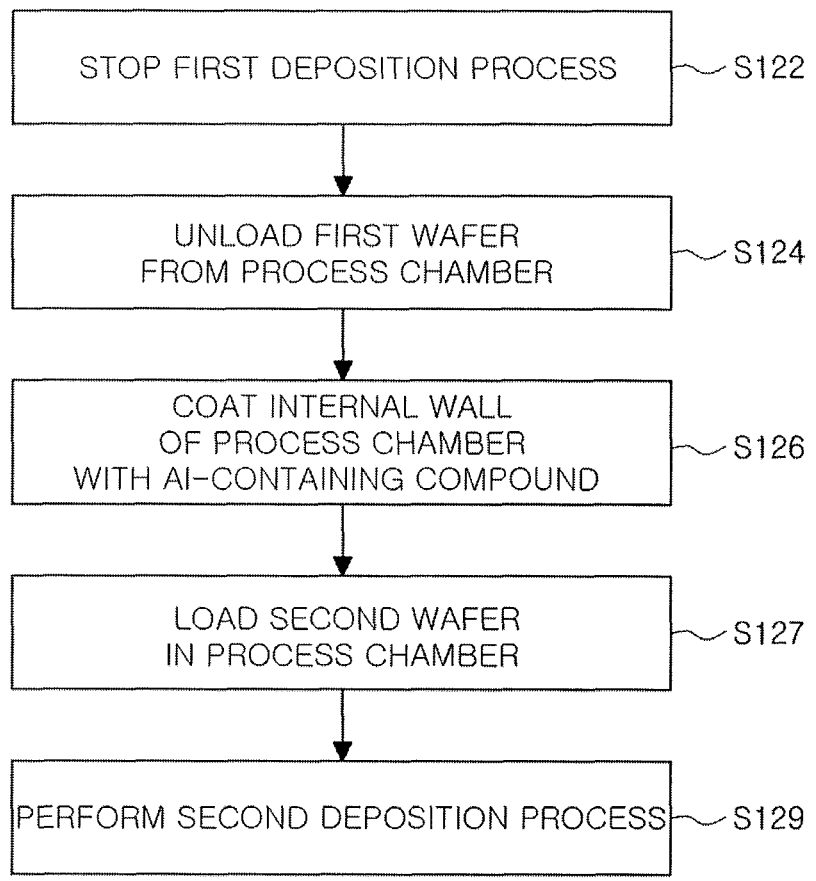
FIG. 23 illustrates a flow chart of a method of manufacturing a semiconductor device according to an exemplary embodiment of the present disclosure.

FIG. 23 illustrates a flow chart of a method of manufacturing a semiconductor device according to an exemplary embodiment of the present disclosure.

First, supply of a source gas for a deposition process to a process chamber may be stopped in S122, and a first wafer may be unloaded from the process chamber in S124.

Before the deposition process and the unloading process for the first wafer, the PM process may not be undertaken and a plurality of runs may be continuously performed. Such a plurality of runs may be an MOCVD process and may be a process of manufacturing a nitride semiconductor device such as a nitride semiconductor light emitting device.

After the plurality of runs, an introduction process of an aluminum compound film in S126 may be performed.

In the process, an aluminum-containing nitride film, e.g., an AlN film, may be formed by supplying at least an aluminum source and a nitrogen source. For example, an aluminum element or aluminum-containing nitride film may be combined with oxygen or an oxygen reactant. In this procedure, oxygen (O) present within the process chamber may be combined with an Al component, and oxygen, which may advantageously act in a subsequent process, may be passivated.

Subsequently, after forming the aluminum compound film, a second wafer may be loaded in the process chamber in S127, and the supply of the source gas may be resumed to deposit a thin film for a semiconductor device on the second wafer in S129.

As in the exemplary embodiment of the present disclosure, the use of the aluminum compound film may be introduced during a plural run process, and an influence on impurities in respective runs may be reduced and distribution thereof may be constantly maintained.

According to exemplary embodiments of the present disclosure, preprocessing of supplying an aluminum (Al) source to an interior of a process chamber may be introduced before a deposition process, whereby unnecessary impurities (for example, oxygen) introduced into or generated in a process chamber during a deposition process or a maintenance process such as a cleaning process may be prevented from disadvantageously affecting deposition thin film (for example, a semiconductor device) characteristics.

The introduction procedure of such an aluminum source may be variously applied at a different point in time. For example, when a deposition process of plural runs is performed, the use of an aluminum source may be properly introduced between specific runs or after a maintenance process before a deposition process.

By way of summation and review, when oxygen remains or is introduced into a process chamber, for example, of a CVD apparatuses, the oxygen may disadvantageously affect deposited film characteristics. For example, a chamber for a SUS material may be oxidized, and a thin film grown in initial run may have differences from thin film characteristics formed in subsequent runs, for example, due to the oxidization thereof.

Nitride semiconductor devices have come into use in, for example, light emitting devices (LED), laser diodes (LD), high output transistors. During a deposition process, unnecessary deposition may occur on surfaces such as an inner wall of a process chamber and a surface contacting source gas flowing from a shower head having a spraying structure, and further, during a PM procedure for maintaining a deposition device, such as a cleaning process for removing undesired deposition material, undesired impurities such as oxygen may be introduced into the process chamber, and deposited thin film characteristics may be disadvantageously affected.

Before a deposition process, a disadvantageous influence, for example, due to oxygen, may be reduced or prevented by coating an internal wall of a process chamber with an aluminum compound film such as an AlN film. For example, after a PM process in which the interior of the process chamber is exposed to an external atmosphere, or between LED runs, the chamber interior for a MOCVD process may be coated with an AlN film, employing an oxygen passivation technology of combining oxygen present within the process chamber with Al (Al—O), and deviation in Mg doping efficiency with respect to a p-type nitride layer, occurring through a plurality of runs performed repetitively, may be reduced or prevented.

Embodiments of the present disclosure may provide a scheme in which when an unnecessary impurity material is introduced into or occurs in a process chamber, the unnecessary deposition material may be processed, and degradation of deposited thin film characteristics may be reduced or prevented.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, comprising:
   cutting supply of a source gas for a deposition process to an interior of a process chamber;
   unloading a first wafer from the process chamber;
   forming an aluminum compound film on a surface of the process chamber contacting the source gas, after the unloading of the first wafer;
   loading a second wafer in the process chamber, after forming the aluminum compound film; and
   resuming the supply of the source gas and depositing a thin film for a semiconductor device on the second wafer.

2. The method as claimed in claim 1, wherein before the cutting of the supply of the source gas, a run of the deposition process for the semiconductor device is performed in plural.

3. The method as claimed in claim 1, wherein at least a portion of the aluminum compound film contains a compound combined with oxygen.

4. The method as claimed in claim 1, wherein the aluminum compound film contains a nitride satisfying $Al_xIn_yGa_{1-x-y}N$ where $0<x\leq1$, $0\leq y\leq1$, and $0<x+y\leq1$.

5. The method as claimed in claim 4, wherein the aluminum compound film is aluminum nitride (AlN).

6. The method as claimed in claim 5, wherein forming the aluminum compound film is performed in a temperature range from about 1000° C. to about 1200° C.

7. The method as claimed in claim 6, wherein forming the aluminum compound film includes supplying the aluminum source to an interior of the process chamber under conditions of a flow rate of about 10 μmol/min to about 1000 μmol/min and a chamber pressure of about 60 Torr to about 500 Torr.

8. The method as claimed in claim 6, wherein the aluminum compound film is an aluminum-containing nitride film, and forming the aluminum compound film includes supplying a nitrogen source together with the aluminum source, to the process chamber, to react with each other.

9. The method as claimed in claim 8, wherein the nitrogen source includes $NH_3$ and the nitrogen source is supplied as a gas mixed with at least one of $N_2$ and $H_2$.

10. The method as claimed in claim 8, wherein the aluminum-containing nitride film has a thickness of 1 μm or more.

11. The method as claimed in claim 1, wherein depositing the thin film for the semiconductor device includes growing a semiconductor laminate for a nitride semiconductor device.

12. The method as claimed in claim 11, wherein the semiconductor laminate includes a nitride semiconductor material doped with a p-type dopant.

13. The method as claimed in claim 12, wherein the semiconductor device is a nitride semiconductor light emitting device.

14. The method as claimed in claim 12, wherein the aluminum source is supplied through a passage through which the p-type dopant is supplied.

15. The method as claimed in claim 1, wherein the surface contacting the aluminum source includes an internal wall of the process chamber and a surface provided as a passage for the aluminum source.

16. The method as claimed in claim 1, wherein the process chamber includes a shower head-type source spraying structure, and the surface contacting the aluminum source includes a surface provided as a passage of the source spraying structure.

* * * * *